United States Patent [19]
Yamagata et al.

[11] Patent Number: 6,059,866
[45] Date of Patent: May 9, 2000

[54] AIR WASHER

[75] Inventors: Masakazu Yamagata, Tokyo; Shuzo Akita, Utsunomiya; Tsuguaki Uemura, Utsunomiya; Masaaki Shinohara, Utsunomiya, all of Japan

[73] Assignees: Sanki Engineering Co., Ltd, Tokyo; Kubota Air Conditioner Ltd., Tochigi; Kubota Corporation, Osaka, all of Japan

[21] Appl. No.: 09/135,032

[22] Filed: Aug. 17, 1998

[30]   Foreign Application Priority Data

Sep. 30, 1997  [JP]  Japan .................................. 9-264706
May 29, 1998  [JP]  Japan ................................. 10-148180
Jun. 10, 1998  [JP]  Japan ................................. 10-161219

[51] Int. Cl.$^7$ ................................................. B01D 47/06
[52] U.S. Cl. ............................. 96/251; 96/265; 96/296; 96/297; 96/300; 96/355
[58] Field of Search ............................ 95/224, 225, 227, 95/228, 220, 216, 211, 199, 187; 96/251, 265, 266, 242, 290, 294, 296, 297, 298, 300, 355

[56]   References Cited

U.S. PATENT DOCUMENTS

| | | | |
|---|---|---|---|
| 1,134,976 | 4/1915 | Braemer et al. | 96/251 |
| 1,222,541 | 4/1917 | Donham | 95/224 |
| 1,422,839 | 7/1922 | De Clamecy | 95/216 |
| 2,057,579 | 10/1936 | Kurth | 96/297 |
| 2,199,632 | 5/1940 | Keyes | 96/297 |
| 3,726,062 | 4/1973 | Hungate et al. | 95/224 |
| 3,733,778 | 5/1973 | Hungate et al. | 95/224 |
| 3,785,127 | 1/1974 | Mare | 96/297 |
| 3,957,464 | 5/1976 | Teller | 95/224 |
| 4,049,399 | 9/1977 | Teller | 95/199 |
| 4,369,167 | 1/1983 | Weir, Jr. | 95/224 |
| 4,397,662 | 8/1983 | Bloomer | 96/297 |
| 4,604,108 | 8/1986 | Cotton, Jr. | 95/224 |
| 5,620,503 | 4/1997 | Miller et al. | 95/227 |
| 5,879,434 | 3/1999 | Kiss | 95/224 |

FOREIGN PATENT DOCUMENTS

| | | |
|---|---|---|
| 5288390 | 2/1993 | Japan . |
| 7042971 | 10/1995 | Japan . |
| 7096122 | 11/1995 | Japan . |

*Primary Examiner*—Duane S. Smith
*Attorney, Agent, or Firm*—Reising, Ethington, Barnes, Kisselle, Learman & McCulloch, PC

[57]   ABSTRACT

Washer media are disposed in an air inlet and an air outlet of a water spray chamber. A basic unit is formed by first stage nozzles from which spraying water that reaches the inlet washer media is sprayed in the reverse direction to an air flow; a water storage tank for receiving spraying water, located in the lower position of the water spray chamber; and a circulating water supply system that circulates the circulating water in the water storage tank to the first stage nozzles. Second stage nozzles from which spraying water directed against the outlet washer media is sprayed in the forward direction to the air flow are disposed in approximately the same positions as the first stage nozzles. There is also provided a supplementary water supply system for supplying supplementary water to the second stage nozzles.

4 Claims, 21 Drawing Sheets

PSYCHROMETRIC CHART
STATE CHANGE IN SUMMER (HIGH LOAD)

PSYCHROMETRIC CHART
STATE CHANGE IN SUMMER (LOW LOAD)

AIR WASHER

BACKGROUND OF THE INVENTION

1. Field of the Invention

The present invention relates to an air conditioning system for use in semiconductor manufacturing factories and the like. More particularly, the present invention relates to an air washer that eliminates dust or harmful gases in air, reduces the supply of pure water used as clean water, and performs humidification with high efficiency of saturation.

2. Description of the Background Art

FIG. 21 shows the outline of a conventional air washer. In FIG. 21, an air washer 1 has a water spray chamber 2 in which air passes through from upstream to downstream. The water spray chamber 2 has a nearly centrally located partition plate 3 that extends in the direction of an air stream (indicated by arrow in the figure). Nozzles 4a of a water sprayer 4 are located opposite the partition plate 3.

In the air washer 1, the nozzles 4a of the water sprayer 4 spray spraying water of pure water so that it collides with the partition plate 3. Dust in the air passing through the water spray chamber 2 collides with the spraying water to reach the partition plate 3 together with the spraying water. Therefore, the dust is trapped by a film of water formed in the surface of the partition plate 3 and then runs down along the partition plate 3 when the film of water falls down.

The above air washer 1 is directed to eliminate the dust in the air and thus has poor efficiency in humidifying the air flowing through the water spray chamber 2.

Specifically, in the cases where air is humidified to be in the vicinity of the saturated state by using the air washer 1, the ratio of spraying water to the flow of air passing through the water spray chamber 2 is required to be set greater than that normally required in eliminating dust. Therefore, a pump for pumping clean water to the nozzles 4a of the water sprayer 4 is required to have extremely large output in order to realize high-saturation humidification.

Now, assume the case where the harmful gas component in the air passing through the water spray chamber 2 is absorbed and eliminated by spraying water. To improve and maintain the efficiency of harmful gas elimination, it is necessary to increase the degree of contact between spraying water and passing air and to hold the cleanliness of the spraying water at a predetermined value and above. In addition, when spraying water is circulated, it is necessary to freshly supply clean water to a circulating system and to hold the concentration of harmful gas component taken in the spraying water at a predetermined value or below.

In the system that circulates spraying water, however, clean water is supplied to a water tank that temporarily stores circulating water, the clean water newly added will function to dilute the concentration of the harmful gases present in the circulating water in the water tank, thus failing to spray the supplied clean water in its fresh state. In other wards, clean water to be supplied as supplementary water is polluted by the harmful gas component in the water tank, thus failing to make full use of the cleanliness of clean water to be supplied.

Moreover, in the cases where all supplementary water is of pure water, a large amount of pure water and a large-capacity apparatus for preparing pure water are needed to increase the initial cost and running cost.

SUMMARY OF THE INVENTION

According to an aspect of the present invention, an air washer has a basic unit comprising a water spray chamber in which an air flow takes place from an air inlet to an air outlet; an inlet washer media disposed in the air inlet of the water spray chamber; an outlet washer media disposed in the air outlet of the water spray chamber; first stage nozzles from which spraying water that reaches the inlet washer media is sprayed in the reverse direction to the air flow, located downstream from the inlet washer media; a water storage tank that receives spraying water running down, located below the water spray chamber; and a circulating water supply system that circulates the circulating water in the water storage tank to the first stage nozzles. There are also provided second stage nozzles from which spraying water directed against the outlet washer media is sprayed in the forward direction to the air flow, disposed at approximately the same positions as the first stage nozzles; and a supplementary water supply system for supplying supplementary water to the second stage nozzles.

In this air washer, the first stage nozzles spray the water to be supplied from the water storage tank so as to oppose to the air flow that flows into the water spray chamber from the air inlet through the inlet washer media. Spraying water collides with dust or harmful gases in the air, and the dust or harmful gases in the air reach the inlet washer media together with the spraying water. The inlet washer media captures the spraying water accompanied with the dust or harmful gases.

When the spraying water that has reached the inlet washer media runs down along the inlet washer media to enter the water storage tank, it washes away the dust attached to the inlet washer media and captures the harmful gases in the air passing through the inlet washer media. The spraying water also evaporates to humidify the air.

Some of the spraying water that failed to reach the first washer media collides with the ceiling, walls or water storage surface of the water spray chamber, and the rest moves along with the air flow to reach the outlet washer media while evaporating to humidify the air and capturing the dust or harmful gases in the air. The outlet washer media then traps the spraying water accompanied with the dust or harmful gases.

When the spraying water that has reached the outlet washer media runs down along the outlet washer media to enter the water storage tank, it washes away the dust attached to the outlet washer media and captures harmful gases, and it also evaporates to humidify the air.

The second stage nozzles spray clean supplementary water on to the outlet washer media so that it spreads widely in the air flow. This spraying water of clean water captures the remaining dust or harmful gases in the air to reach the outlet washer media. The outlet washer media then traps the spraying water accompanied with the dust or harmful gases.

When the spraying water that has reached the outlet washer media runs down along the outlet washer media to enter the water storage tank, it washes away the dust attached to the outlet washer media and capturing harmful gases, and it also evaporates to humidify the air. The circulating water stored in the water storage tank circulates through the circulating water supply system so that it is sprayed again from the first stage nozzles.

As described, the spraying water sprayed from the first stage nozzles flows so as to oppose to the air flow to reach the inlet washer media and, furthermore it returns in the forward direction of the air flow to reach the outlet washer media, thus increases the efficiency of contact with dust or harmful gases.

Accordingly, even when the ratio of spraying water to the flow of air is lowered than that in the case without any consideration as to the spray direction of spraying water, the dust or harmful gases in air is efficiently absorbed and eliminated, the air is efficiently humidified, and dust or harmful gases are thoroughly captured and eliminated by the inlet and outlet washer media. It is therefore possible to reduce the outputs of actuators, such as pumps in the circulating water supply system.

In addition, since the clean water sprayed from the second stage nozzles becomes spraying water with the initial cleanliness retained, an efficient use of its cleanliness leads to high eliminating capability. That is, an efficient use of the cleanliness of the spraying water is attained by gradually spraying waters of different cleanliness while changing their respective spray positions and directions, at a fixed distance between the inlet washer media and the outlet washer media.

The clean water that has run into the water storage tank is joined with circulating water as supplementary water, and passes through the circulating water supply system so that it is sprayed from the first stage nozzles as circulating water. The air passed through the outlet washer media is cleaned and then discharged from the air outlet as clean air fully humidified.

The supplementary water serves to supplement a reduction in the circulating water which is decreased as the air is humidified, and to supply water to the second stage nozzles and the water storage tank in an amount necessary to maintain the concentrations of the harmful gases in the circulating water at a predetermined value and below. Excess water is discharged from an overflow pipe disposed at the desired water level in the water storage tank.

According to another aspect of the present invention, an intermediate washer media is located downstream of the first stage nozzles, and second stage nozzles from which spraying water is sprayed in the forward or reverse direction to the air flow, are located downstream of the intermediate washer media.

Therefore, an effective use of the cleanliness of spraying water is accomplished by dividing the area between the inlet and outlet washer media by the intermediate media, and by spraying waters of different cleanliness in different regions.

That is, the clean water sprayed from the second stage nozzles is brought into contact with the harmful gases passed through the inlet washer media and the intermediate washer media, while maintaining the initial cleanliness of the clean water, free from the spraying water sprayed from the first stage nozzles. This permits an effective use of the cleanliness of the clean water to exhibit high eliminating capability.

According to another aspect of the present invention, another basic unit is continuously positioned upstream of the air flow, a connecting pipe is provided which connects the water storage tank of the basic unit located upstream with that of the basic unit located downstream, and an overflow pipe is provided in the water storage tank of the basic unit located upstream.

With this construction, a multistage purification of air to be introduced is attained and water of higher cleanliness is sprayed as it goes downstream of the air flow, thereby improving gas eliminating effect. This permits use in the areas in which the concentrations of atmospheric harmful gases are high.

According to another aspect of the present invention, as a supplementary water system, a supply system for the water storage tank and a supply system for the second stage nozzles are placed separately to supply pure water to the second stage nozzles.

With this construction, all supplementary water need not be pure water while performing the elimination of harmful gases taking advantage of the cleanliness of pure water. This lessens pure water consumption.

An air conditioning system having an air washer according to the present invention comprises an air washer including a water spray chamber in which an air flow takes place from an air inlet to an air outlet, an inlet washer media disposed in the air inlet of the water spray chamber, an outlet washer media disposed in the air outlet of the water spray chamber, and nozzles from which spraying water directed against the inlet washer media is sprayed in the reverse direction to the air flow; heat exchange means for heating or cooling air to a predetermined water spray chamber outlet temperature higher than a target temperature, located upstream from the air inlet of the water spray chamber; cooling means for cooling air to a target temperature, located downstream from the air outlet of the water spray chamber; heating means for heating the air cooled with the cooling means to a predetermined outlet temperature; connecting means for controlling heat exchange fluid medium flow between the heat exchange means and the heating means; temperature detecting means for detecting the temperatures of air present in their respective positions in the air washer, cooling means and heating means; and control means for controlling the heat exchange means, cooling means, heating means and connecting means, based on the detected values of the temperature detecting means.

With the above construction, the air passed through the heat exchange means is humidified to be in the vicinity of saturation curve and also cleaned in the air washer. That is, the spraying water sprayed in the air flow captures the dust or harmful gases contained in the air to reach the inlet washer media or the outlet washer media, thereby trapping the spraying water accompanied with the dust or harmful gases.

The air humidified by passing through the water spray chamber is cooled to a target temperature and dehumidified to a target absolute humidity in the cooling means, and the resulting condensed water captures the remaining dust or harmful gases in the air.

Since the above cooled air has the target absolute humidity, it can have the desired temperature and humidity only by a simple control, i.e., heating with the heating means.

When the heat exchange means runs in a cooling mode, the control means controls the connecting means to allow heat exchange fluid medium flow between the heat exchange means and the heating means. The medium having the thermal energy which has transferred from the air in the heat exchange means is fed to the heating means through the connecting means and, by this thermal energy, the air cooled by passing through the cooling means is heated to a predetermined outlet temperature. The medium whose thermal energy has been removed in the heating means is supplied to the heat exchange means and then used as a cooling medium. When the heat exchange means runs in a heating mode, the control means controls the connecting means to stop the heat exchange fluid medium flow between the heat exchange means and the heating means.

Therefore, during the summer in which the tremendous energy is consumed in cooling and reheating (heating), the thermal energy which has transferred from the air to the medium in the heat exchange means is utilized in the heating means as heating energy, and the medium whose thermal energy has been removed in the heating means is utilized in the heat exchange means as a cooling medium, thereby suppressing energy consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described with respect to the accompanying drawings.

First Preferred Embodiment

Figure 1:
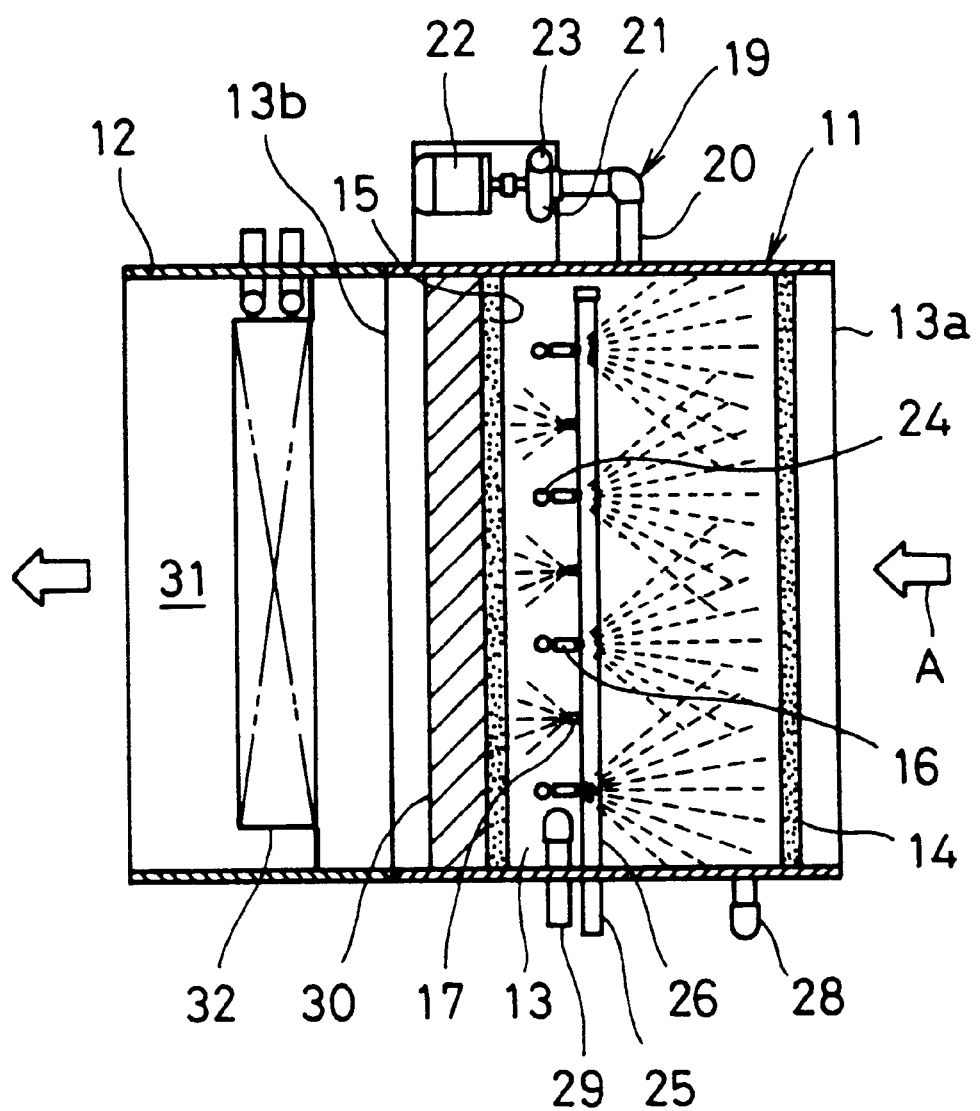
FIG. 1 is a plan sectional view of an air washer according to one preferred embodiment of the present invention.
Figure 2:
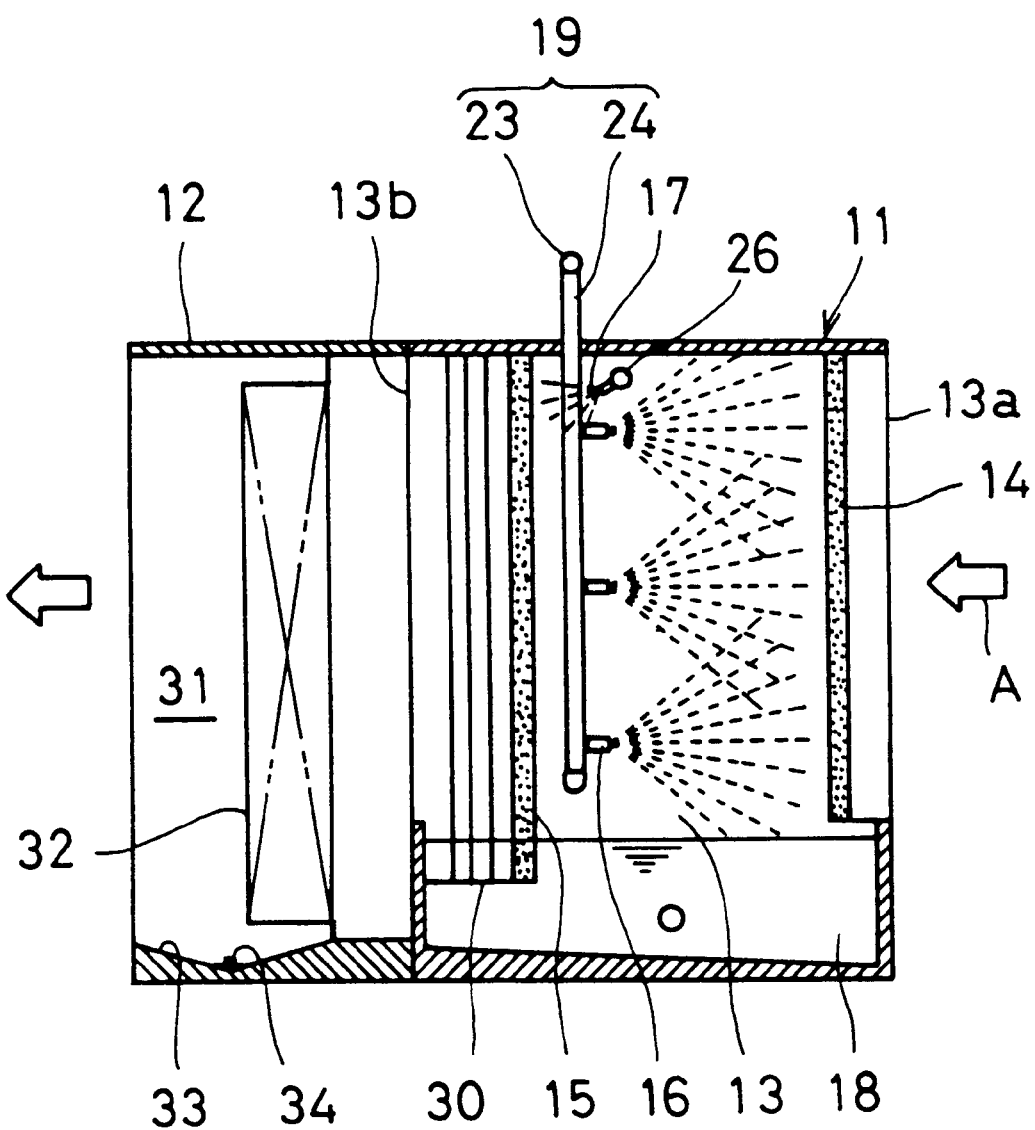
FIG. 2 is a longitudinal sectional view of the above air washer.
Figure 3:
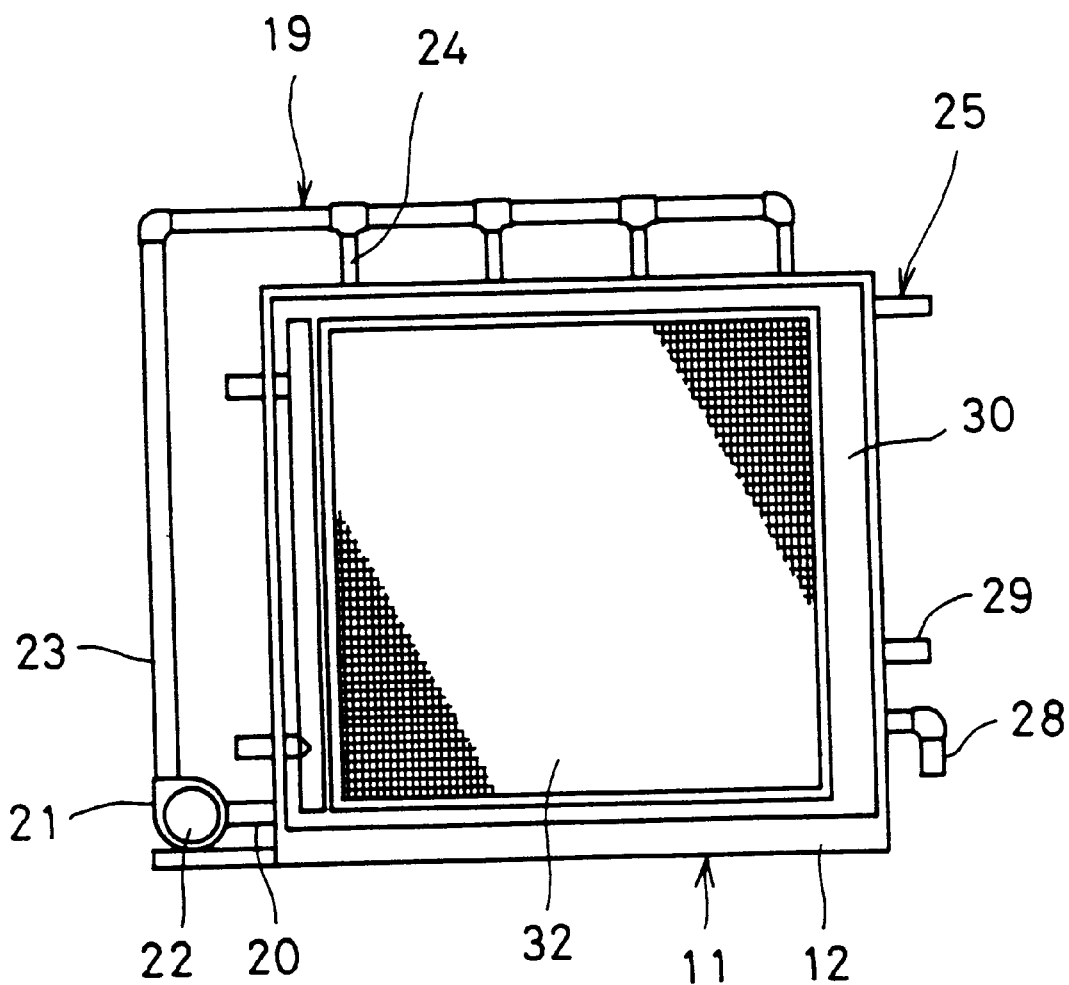
FIG. 3 is a transverse sectional view of the above air washer.

Referring to FIGS. 1 to 3, an air washer 11 has a water spray chamber 13 of a predetermined length placed in the interior of a body casing 12 having a rectangular flow passage section. The water spray chamber 13 is connected to a duct (not shown) in an air inlet 13a formed in one end of the water spray chamber 13. Air A to be introduced from the duct passes through the flow passage of the water spray chamber 13 and then comes off from an air outlet 13b formed in the other end.

In the water spray chamber 13 there are provided an inlet washer media 14 disposed in the air inlet 13a and an outlet washer media 15 disposed in the air outlet 13b. The washer media 14 and 15 have approximately the same shape as the flow passage section of the air flow, are made of polyvinylidene chloride fibers, the wire of stainless steel, or the like, and are in a mat-shape with a thickness of about 25–50 mm, for example.

In the water spray chamber 13, a plurality of first stage nozzles 16 connected to a circulating water supply system as described later are located downstream from the inlet washer media 14, and a plurality of second stage nozzles 17 connected to a supplementary water supply system as described later are located at approximately the same positions as the first stage nozzles 16.

The first stage nozzles 16 spray spraying water that reaches the inlet washer media 14 in the reverse direction to the air flow. The second stage nozzles 17 spray spraying water that is directed against the outlet washer media 15 in the forward direction to the air flow.

The pressure of the spraying water from the first stage nozzles 16 and the distance between the first stage nozzles 16 and the inlet washer media 14 are set so as to satisfy the following conditions.

Specifically, a predetermined spray angle (about 60–70°) is ensured, and some of the spraying water (about one-third) collides with the inlet washer media 14, with a predetermined flow of air admitted into the water spray chamber 13. Some of the remaining water (about one-third, i.e., two-ninths of all water) collides with, for example, the ceiling or walls of the water spray chamber 13. Still remaining water (five-ninths of all water) moves together with the air flow to collide with the outlet washer media 15.

The pressure of spraying water, location and spray direction of the second stage nozzles 17 are set so as to satisfy the following conditions.

Specifically, spraying water diffuses widely and collides with the outlet media 15, with a predetermined flow of air admitted into the water spray chamber 13. For instance, spraying water is sprayed at a spray angle of about 60–70°, by locating the nozzles 17 in the upper part of the chamber 13 and facing obliquely downwardly.

A water storage tank 18 that receives the spraying water running down is provided in the lower part of the water spray chamber 13. A circulating water supply system 19 which circulates the circulating water stored in the water storage tank 18 to the first stage nozzles 16, is in communication with the water storage tank 18.

The circulating water supply system 19 is connected to a suction pipe 20 opening into the lower part of the water storage tank 18, a circulating pump 21 connected to the suction pipe 20, a motor 22 for driving the circulating pump 21, and to the discharge opening of the circulating pump 21. The system 19 consists of a first stage discharge pipe 23 placed in the upper part of the water spray chamber 13, and a plurality of first stage branching pipes 24 branching off of the first stage discharge pipe 23 which are disposed perpendicularly with respect to the first stage discharge pipe 23. Each of the first stage branching pipes 24 is provided with a plurality of first stage nozzles 16 as stated above.

A supplementary water supply system 25 that supplies pure water or clean water to the second stage nozzles 17 as supplementary water, has a water supply pipe 26 located in the upper part of the water spray chamber 13. The pipe 26 is connected to a pure water supplying device (not shown) or a clean water supplying device (not shown). The pipe 26 is provided with a plurality of second stage nozzles 17 as stated above.

An overflow pipe 28 and a second supplementary water supply pipe 29 for supplying clean water as supplementary water, are in communication with the water storage tank 18. The second supplementary water supply pipe 29 is in communication with a clean water supply device (not shown).

An eliminator 30 that eliminates the water droplets or the like contained in the air passed through the water spray chamber 13, is located downstream of the water spray chamber 13. A cooling chamber 31 is connected to the air outlet 13b of the water spray chamber 13. The cooling chamber 31 has a predetermined length and a flow passage section whose shape is similar to that of the water spray chamber 13. A cooling coil 32 serving as a cooler is provided in the cooling chamber 31, and a drain pan 33 is formed in the lower part of the cooling chamber 31. A drain pipe 34 extending externally is connected to the recess of the drain pan 33. A blower (not shown) is located downstream of the water spray chamber 13, and air is introduced into the flow passage of the water spray chamber 13 by operating the blower.

Operation in the above construction will be described hereafter. Air A enters a water spray chamber 13 through an air inlet 13a and an inlet washer media 14. The spraying water of a water storage tank 18 is sprayed from first stage nozzles 16 so that it opposes to the flow of the air A.

The spraying water collides with the dust or harmful gases in air and the dust or harmful gases in the air reach the inlet washer media 14 together with the spraying water, so that the inlet washer media 14 traps the spraying water accompanied with the dust or harmful gases. In the inlet washer media 14, the spraying water washes away the dust attached thereto and captures harmful gases when it runs down along the media 14 to the water storage tank 18. The spraying water also evaporates to humidify air while it runs down.

Some of the spraying water that failed to collide with the first washer media 14 collides with the ceiling, walls or storage surface of the water spray chamber 13, and the rest moves together with the air flow. In the course of the movement, it evaporates to humidify the air and captures dust or harmful gases in the air to reach an outlet washer media 15, thereby trapping the spraying water accompanied with the dust or harmful gases.

On the other hand, pure water or clean water is sprayed on to the air flow in the water spray chamber 13 by means of second stage nozzles 17. This spraying water captures the remaining dust or harmful gases in the air to reach the outlet washer media 15, thereby trapping the spraying water accompanied with the dust or harmful gases.

In the outlet washer media 15, the spraying water washes away the dust attached thereto and captures harmful gases when it runs down along the media 15 to the water storage tank 18. The spraying water also evaporates to humidify the air while it runs down.

The clean water or pure water that has entered the water storage tank 18 is joined with circulating water, as supplementary water, and then is sprayed from the first stage nozzles 16 as circulating water, through a circulating water supply system 19.

The air passed through the outlet washer media 15 is cleaned and then introduced into an eliminator 30 as clean water being fully humidified, through an air outlet. The eliminator 30 eliminates the droplets in the air. The air coming off of the eliminator 30 is introduced into a cooling chamber 31 and then cooled with a cooling coil 32.

Thus, since the circulating water decreases as the air is humidified in the above course, the required supplementary water is supplied to the circulating system of the circulating water, in order to supplement a decrease in the circulating water and to maintain the concentrations of harmful gases in the circulating water at a fixed value and below. Since in the second stage nozzles 17 clean or pure water runs into the water storage tank 18 as supplementary water, the supplementary water is supplied to the water storage tank 18 through a second supplementary water supply pipe 29 in an amount which is obtained by reducing the amount of such clean or pure water from the required amount. As the supplementary water supplied from the pipe 29, clean water being suitably cleaned, e.g., service water (free from chlorine) is employed instead of pure water. Alternatively, a supplementary water supply system 25 that supplies supplementary water to the second stage nozzles 17 may supply all the required supplementary water, and the second supplementary water supply pipe 29 may supply supplementary water only when an emergency exists.

Second Preferred Embodiment

Figure 4:
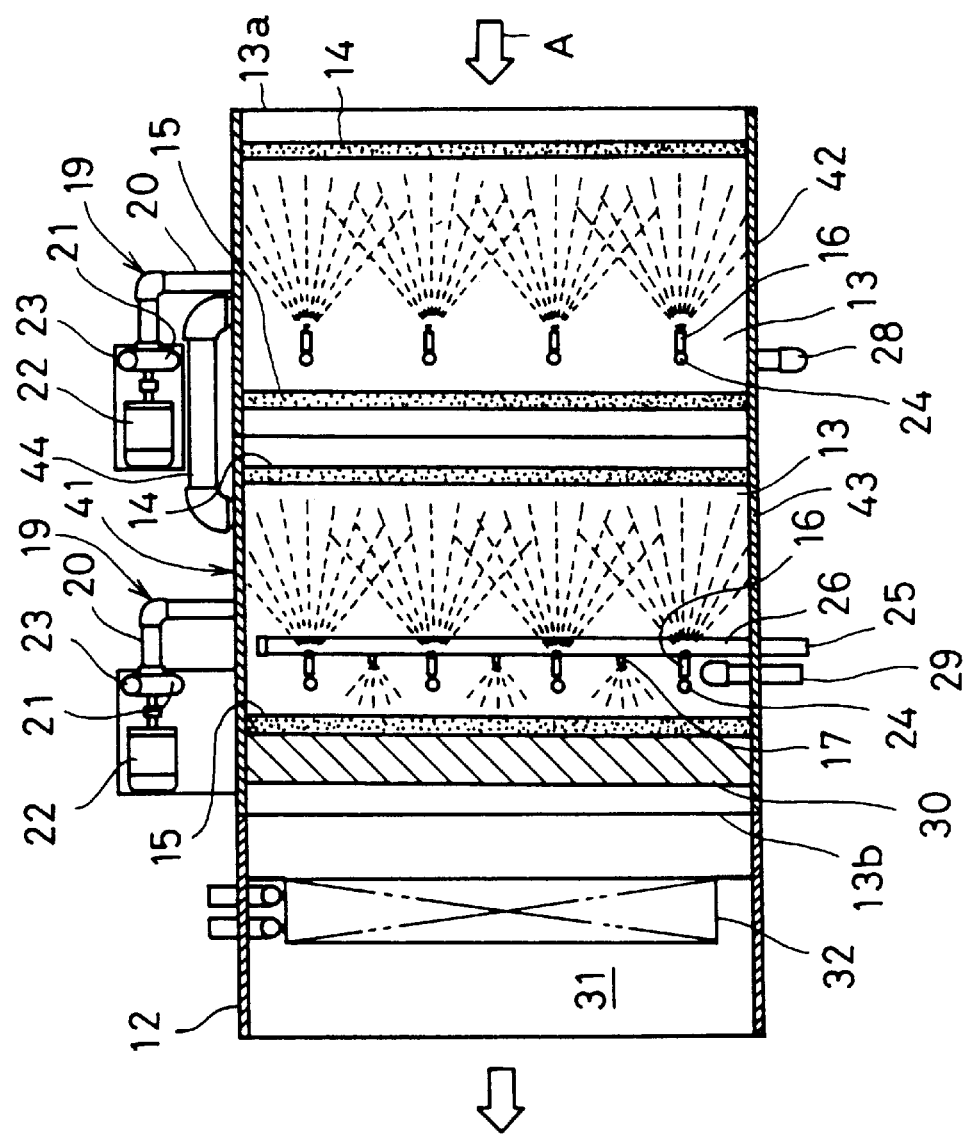
FIG. 4 is a plan sectional view of an air washer according to another preferred embodiment of the present invention.
Figure 5:
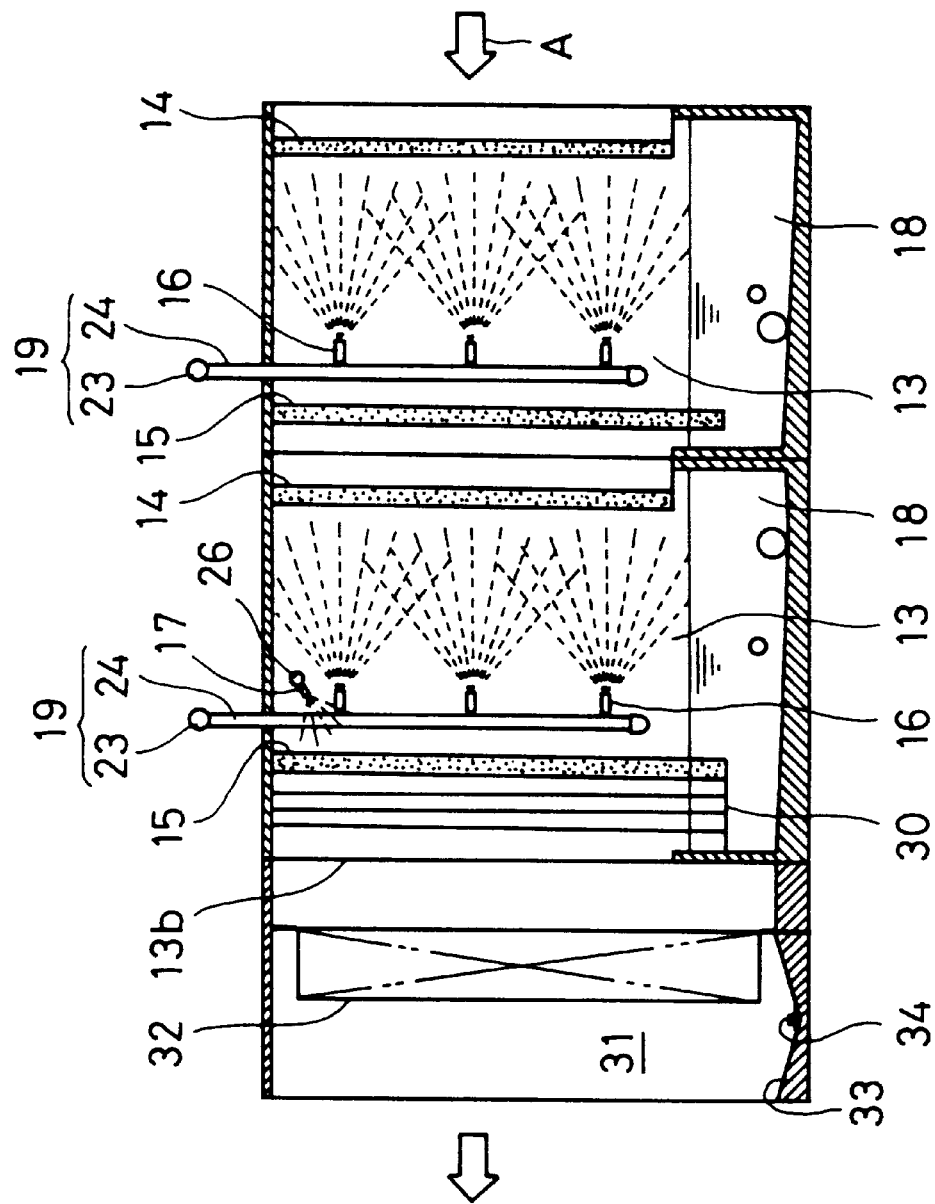
FIG. 5 is a longitudinal sectional view of the above air washer.
Figure 6:
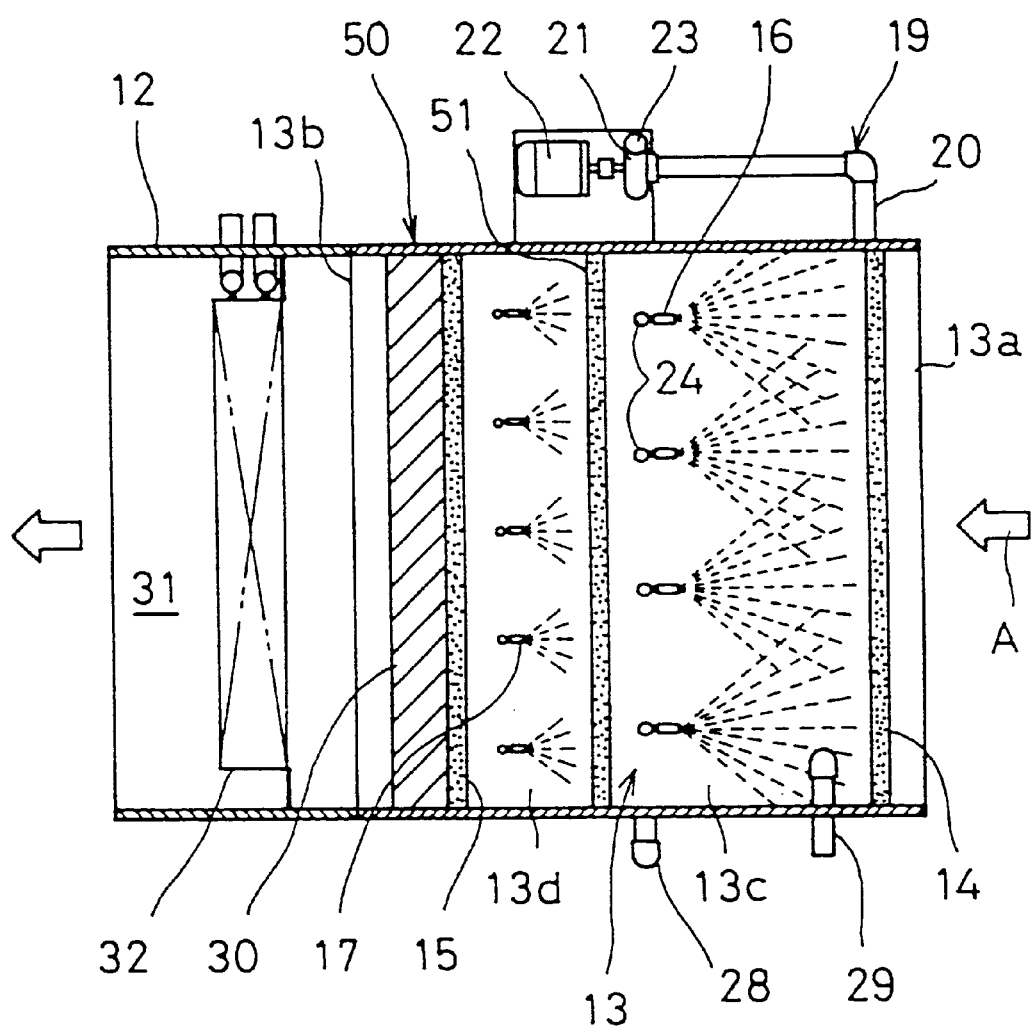
FIG. 6 is a plan sectional view of an air washer according to another preferred embodiment of the present invention.
Figure 7:
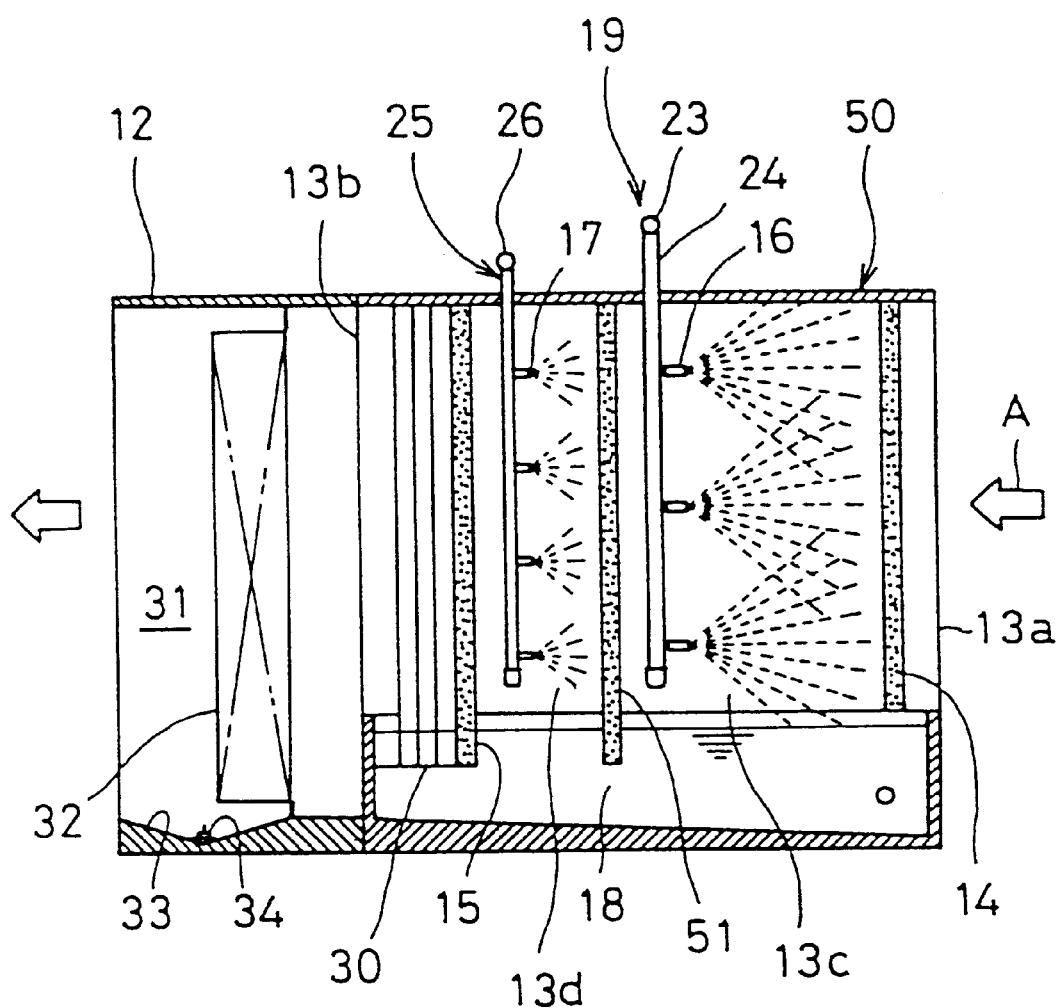
FIG. 7 is a longitudinal sectional view of the above air washer.
Figure 8:
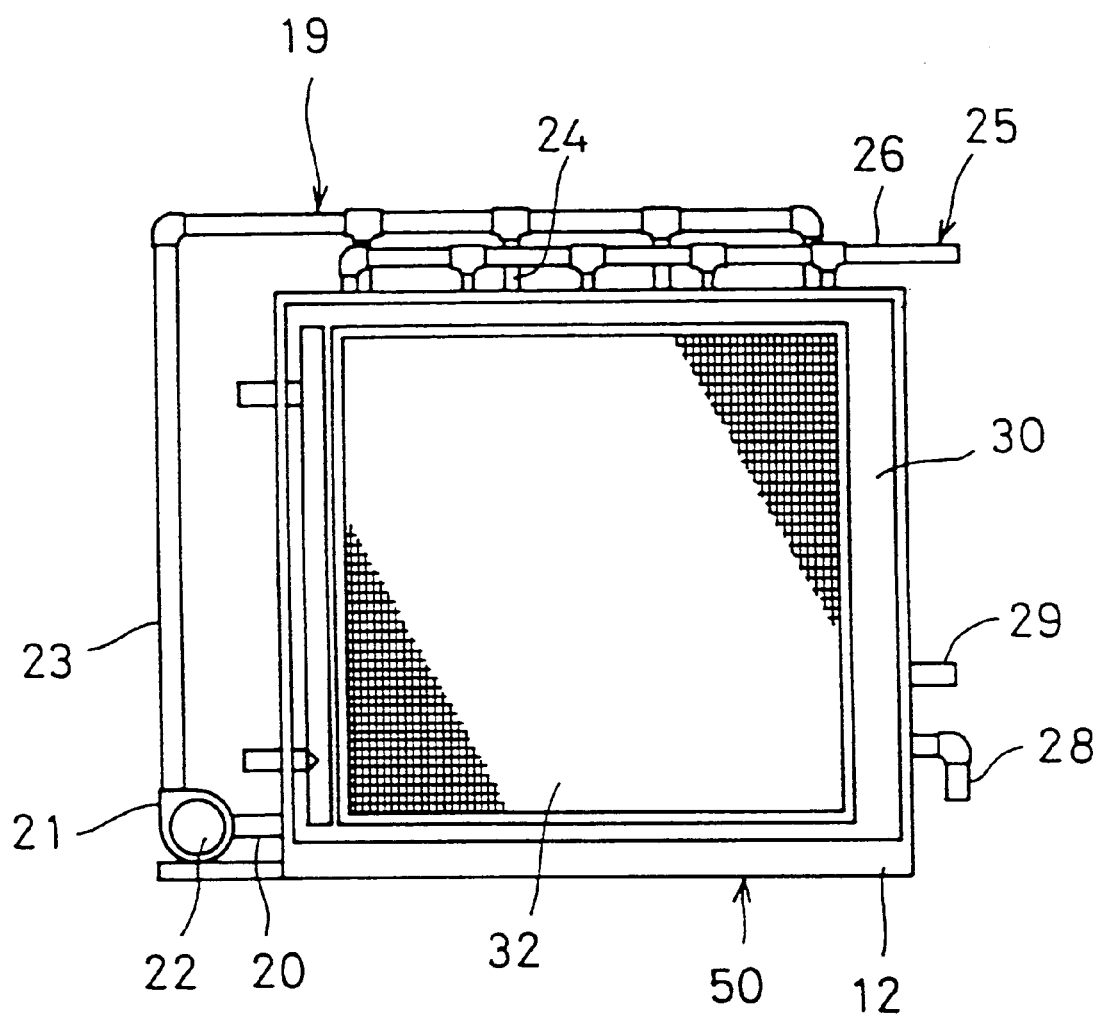
FIG. 8 is a transverse sectional view of the above air washer.

A second preferred embodiment is shown in FIGS. 4 and 5 wherein the same reference numerals have been retained for similar parts which have the same functions as in the first preferred embodiment, with their description omitted.

Referring to FIGS. 4 and 5, an air washer 41 has basic units 42 and 43, each comprising a water spray chamber 13, an inlet washer media 14, an outlet washer media 15, first stage nozzles 16, a water storage tank 18 and a circulating water supply system 19. The basic units 42 and 43 are connected to each other along an air flow.

Second stage nozzles 17 and a supplementary water supply system 25 are provided in the basic unit 43 located downstream. The water storage tank 18 of the basic unit 42 located upstream and the water storage tank 18 of the basic unit 43 located downstream are in communication through a connecting pipe 44. An overflow pipe 28 is provided in the water storage tank 18 of the basic unit 42 located upstream.

With this construction, a multistage purification of air to be introduced is performed in each basic unit. In addition, water of higher cleanliness is sprayed as it goes downstream of an air flow, and thus enhances gas elimination effect. This permits use in the areas in which the concentrations of atmospheric harmful gases are high.

A list of the effects of the present invention is given in Table 1. As can be seen from Table 1, excellent purifying effects are attained in both cases where the first preferred embodiment having a single basic unit is applied to the atmosphere with the ordinary concentrations of gases, and where the second preferred embodiment having two continuous basic units is applied to the atmosphere with high concentrations of gases.

TABLE 1

| Kind of gas | Rate of gas elimination (%) | | Gas concentration in atmosphere ($\mu g/m^3$) | |
|---|---|---|---|---|
| | 1st Pref. Embodiment | 2nd Pref. Embodiment | Ordinary area | High concentration area |
| $SO_2$ | 91 [94] | 98 [99.5] | 10–20 | 100–180 |
| $NO_2$ | 35 [40] | 45 [50] | 10–20 | 30–50 |
| NO | 40 [50] | 55 [60] | 5–10 | 20–30 |
| $NH_3$ | 89 [97] | 98 [99.5] | 5–15 | 30–60 |

Remarks: values in [ ] are obtained when a cooling coil is operated.

Third Preferred Embodiment

A third preferred embodiment is shown in FIGS. 6 to 9 wherein the same reference numerals have been retained for similar parts which have the same functions as in the foregoing embodiments, with their description omitted.

In an air washer 50 there is placed an intermediate washer media 51 in the course of the flow passage of a water spray chamber 13. The intermediate washer media 51 is identical with an inlet washer media 14 and an outlet washer media 15. The intermediate washer media 51 divides the area between the inlet washer media 14 and the outlet washer media 15 into a first area 13c and a second area 13d.

First stage nozzles 16 are located downstream of the inlet washer media 14, and second nozzles 17 are located downstream of the intermediate washer media 51. The second stage nozzles 17 spray spraying water that does not reach the intermediate washer media 51 in the reverse direction to the air flow.

The pressure of spraying water from the second stage nozzles 17 is set so that with a predetermined flow of air admitted into the water spray chamber 13, the spraying water moves together with the air flow to collide with the outlet washer media 15 before it collides with the intermediate washer media 51.

Figure 10:
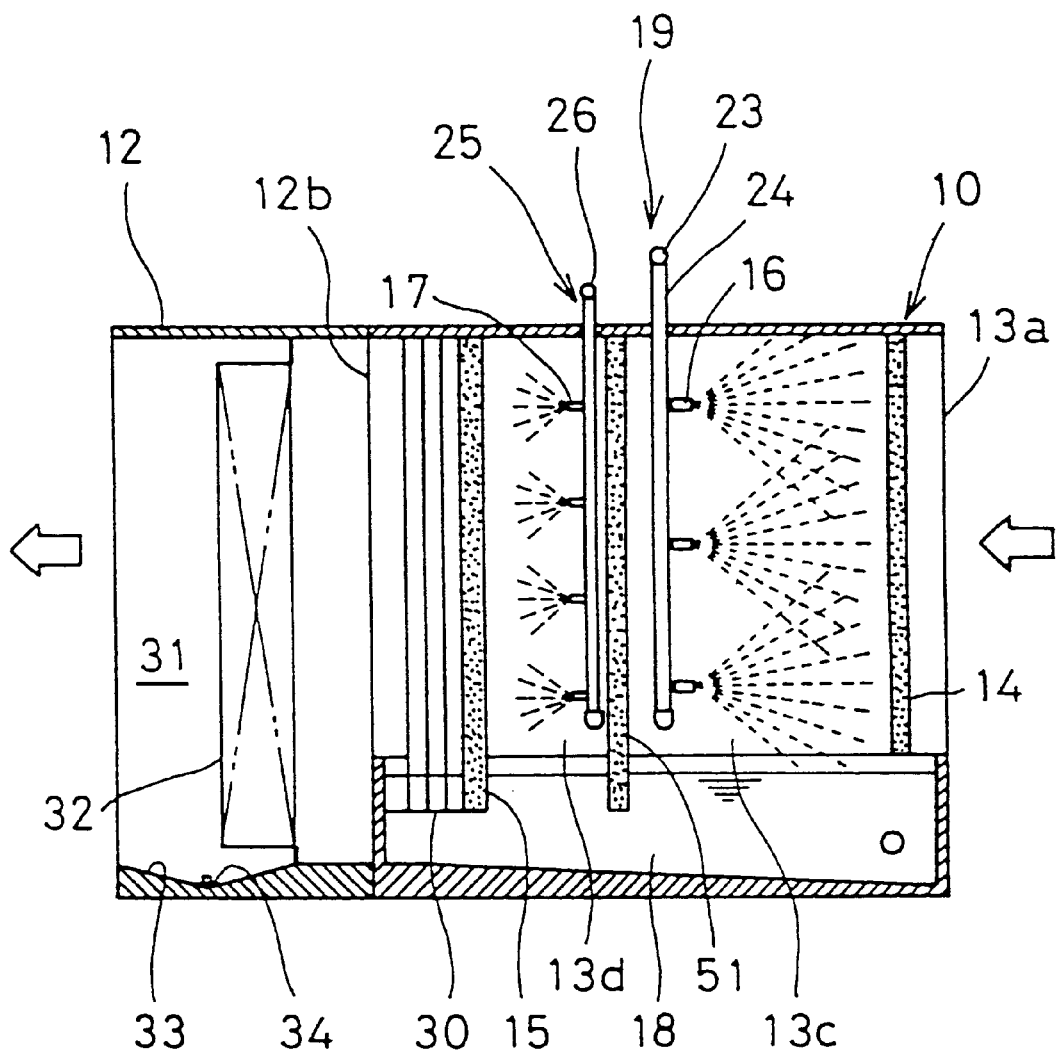
FIG. 10 is a longitudinal sectional view of an air washer according to another preferred embodiment of the present invention.
Figure 11:
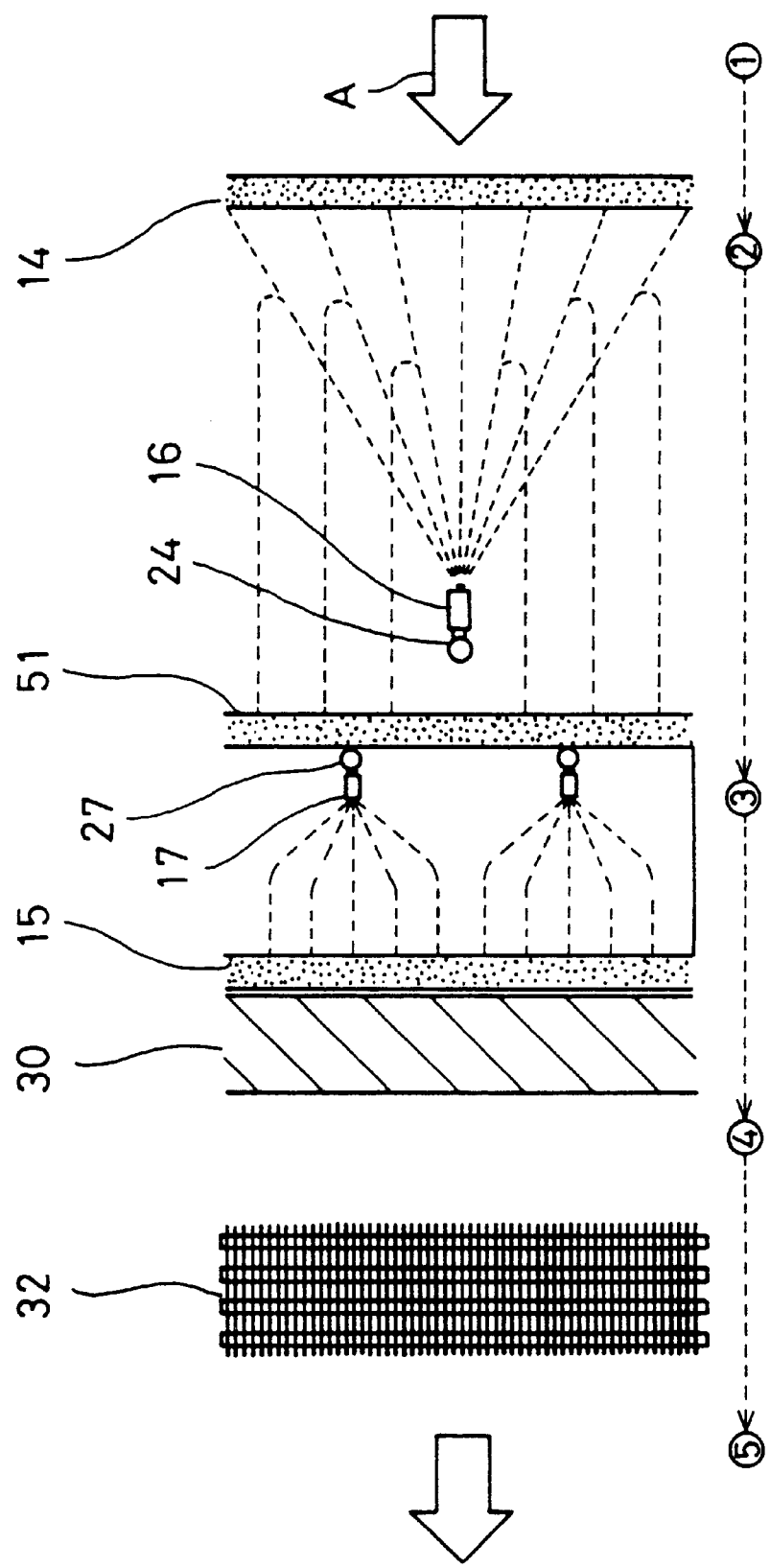
FIG. 11 is a schematic view illustrating the flow of spraying water in the above air washer.

The second stage nozzles 17 may spray spraying water in the forward direction to the air flow, as shown in FIGS. 10 and 11.

With the above construction, the spraying water sprayed from the first stage nozzles 16 in the first area 13c reaches the inlet washer media 14 together with the dust or harmful gases in the air. The inlet washer media 14 then traps the spraying water accompanied with the dust or harmful gases. The spraying water that failed to collide with the inlet washer media 14 moves together with the air flow and, in the course of the movement, it evaporates to humidify the air while capturing dust or harmful gases in the air, and then reaches the intermediate washer media 51, thereby trapping the spraying water accompanied with the dust or harmful gases. When spaying water runs down along the intermediate washer media 51 to a water storage tank 18, it washes way the dust attached thereto and captures harmful gases. The spraying water also evaporates to humidify the air while it runs down.

The air flow passed through the intermediate washer media 51 flows into the second area 13d of the water spray chamber 13. To this air flow, clean water or pure water is sprayed from the second stage nozzles 17. The spraying water of the clean water or pure water collides with the remaining dust or harmful gases in the air, and such dust or harmful gases reach the outlet washer media 15 together with the spraying water. The media 15 then traps the spraying water accompanied with the dust or harmful gases.

Therefore, the clean water sprayed from the second stage nozzles 17 is brought into contact with the harmful gases passed through the inlet washer media 14 and the intermediate washer media 51, while maintaining the initial cleanliness of the clean water, free from the spraying water from the first stage nozzles 16. This permits an effective use of the cleanliness of the clean water to exhibit high eliminating capability.

Figure 9:
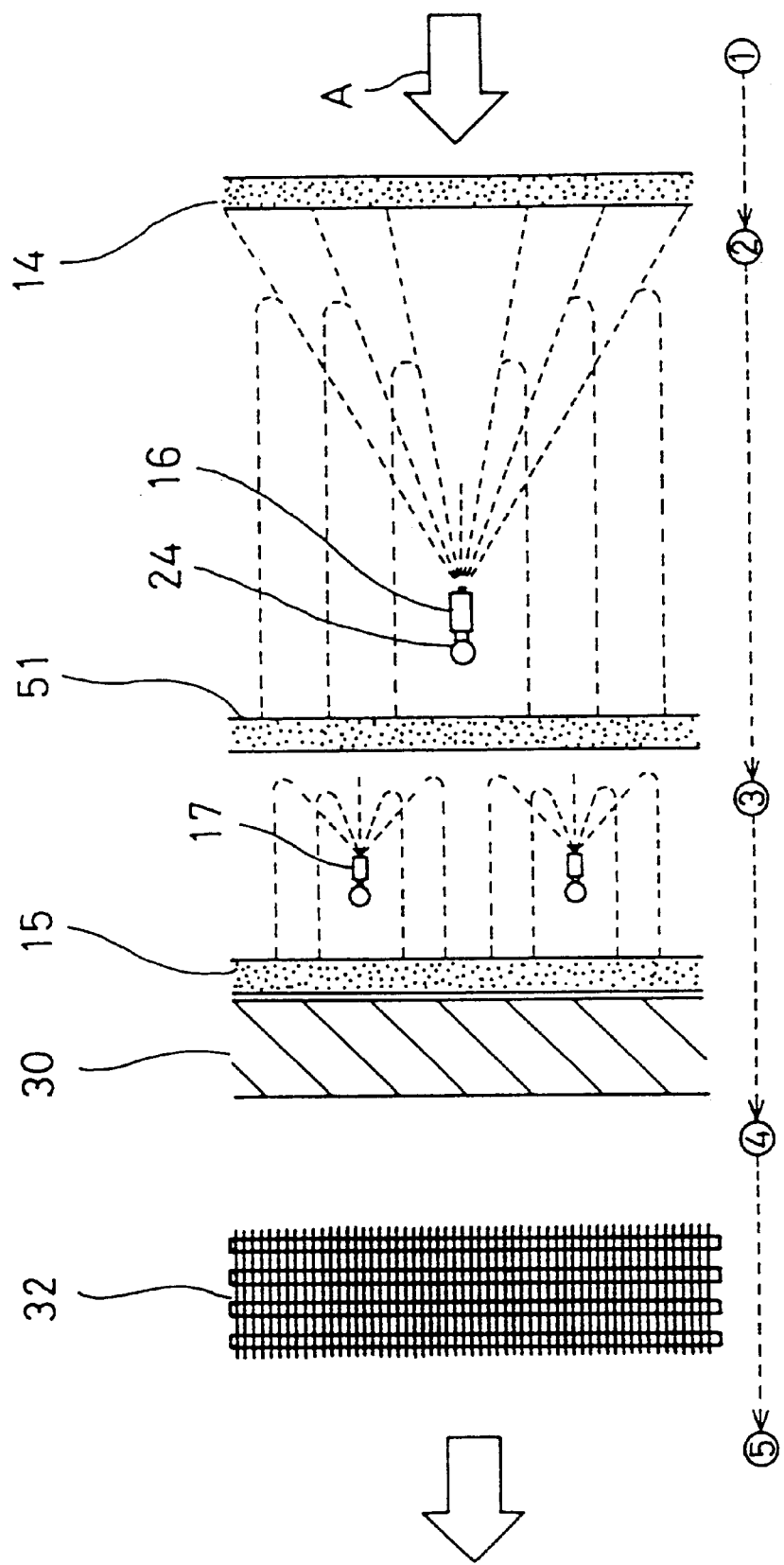
FIG. 9 is a schematic diagram illustrating the flow of spraying water in the above air washer.
Figure 12:
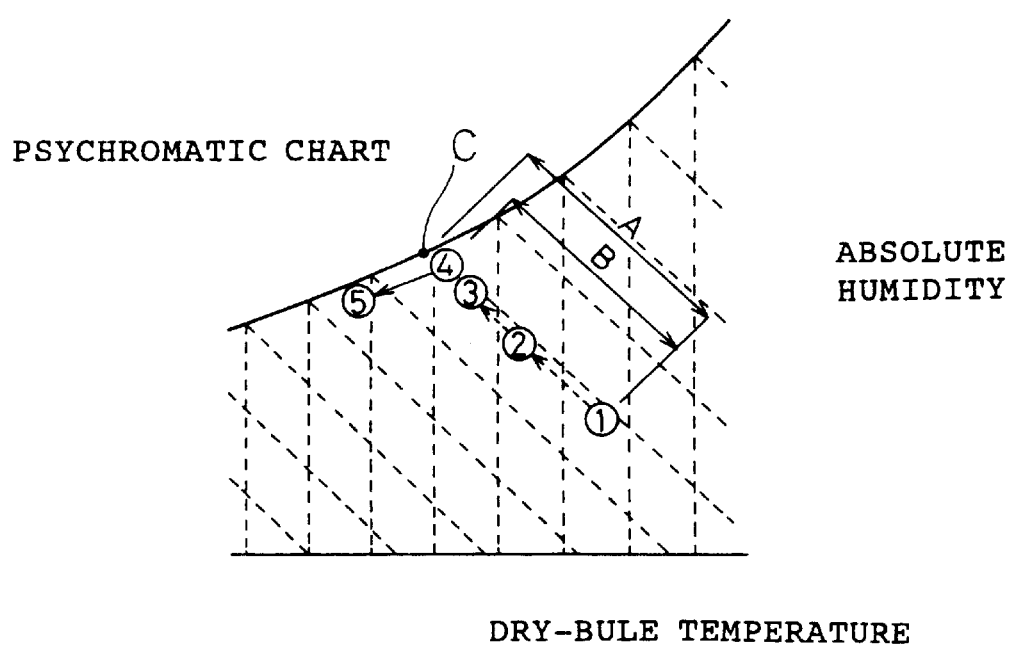
FIG. 12 is a psychrometric chart illustrating the changes in air state in the above air washer.

The psychrometric chart shown in FIG. 12 indicates the changes in the state of air present in their respective positions of the air washer shown in FIG. 9. Symbols ① to ⑤ in FIG. 9 correspond to those in FIG. 11. That is, ① denotes the state of air immediately before an inlet washer media 14; ② denotes the state of air immediately after passing through the inlet washer media 14; ③ denotes the state of air immediately after passing through an intermediate washer media 51; ④ denotes the state of air immediately after passing through an eliminator 30; and ⑤ denotes the state of air immediately after passing through a cooling coil 32.

Since the spraying water from the first stage nozzles 16 is not heated nor cooled, the air causes adiabatic changes during ① to ④ and varies on a wet-bulb temperature fixed line so as to increase its relative humidity. Then, from ④ to ⑤, the air is cooled to the desired absolute humidity along saturation line by means of the cooling coil 32. Here, the ratio of the temperature difference of the dry-bulb temperature (abscissa) from ① to ④, i.e., zone B, to the temperature difference of the dry-bulb temperature (abscissa) from ① to the intersection between the line from ① to ④ and the saturation line (saturation point C), i.e., zone A, becomes the efficiency of saturated humidification of the air washer.

The amount of supplementary water required when ammonia gas is a target gas eliminated will be described hereafter. Let the rate of gas elimination be $\eta$, the required amount of supplementary water be $Q_F$ ($m^3/s$), the amount of air be $Q_G$ ($m^3/s$), the amount of water due to evaporation (humidification) be $Q_B$ ($m^3/s$), the gas concentration in spraying water be $C_W$ ($mol/m^3$), the gas concentration of the inlet air of the first area 13c be $C_{G1}$ ($mol/m^3$), and the gas concentration of the inlet air of the second area 13d be $C_{G2}$ ($mol/m^3$). For circulating water spraying, $Q_F$ ($m^3/s$)= $Q_G \cdot \eta \cdot C_{G1}/100 C_W + Q_B$. The ratio of water to air=the amount of spraying water (kg/h)/the amount of air (kg/h). The amount of air (kg/h)=the amount of air ($m^3$/h)×1.2 (density of standard air kg/$m^3$).

Now, assume that the amount of air $Q_G$=9000 $m^3$/h (2.5 $m^3$/s, 10800 kg/h), the gas concentration of the inlet air $C_{G1}$=5.0×10$^{-6}$ mol/$m^3$, 20° C. in dry-bulb temperature and 45% in relative humidity, the amount of water due to evaporation (humidification) $Q_B$=0.8×10$^{-5}$ $m^3$/s.

Then, assume that the amount of circulating water spray is 108 litters/min. (1.8×10$^{-3}$$m^3$/s), the ratio of water to air becomes 0.6.

Figure 13:
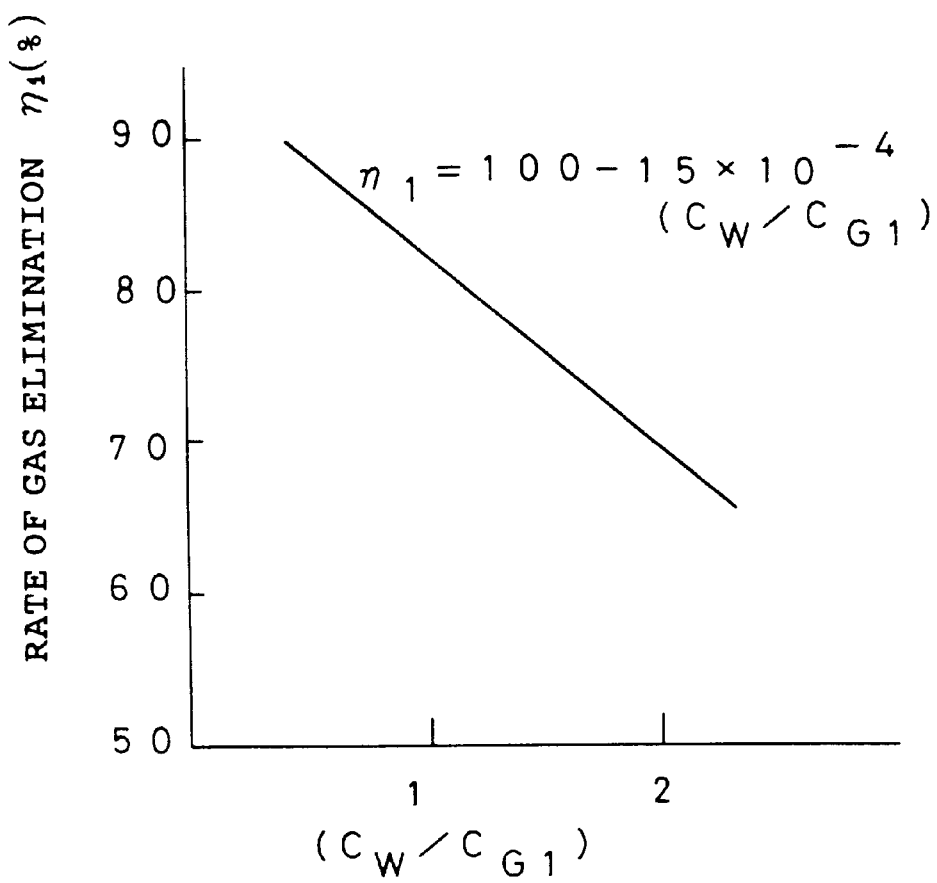
FIG. 13 is a graph diagram that shows the relationship between the $C_W/C_{G1}$ of ammonia gas and the rate of gas elimination $\eta_1$, when the ratio of water to air in the above air washer is 0.6.

FIG. 13 shows the relationship between the $C_W/C_{G1}$ of ammonia gas and the rate of gas elimination $\eta_1$, when the ratio of water to air is 0.6. When a target rate of gas elimination $\eta_1$ in the first area is set to 85%, the required amount of supplementary water $Q_F$=2.21×10$^4$$m^3$/s (13.4 litters/min.), which corresponds to the ratio of water to air of 0.074.

Figure 14:
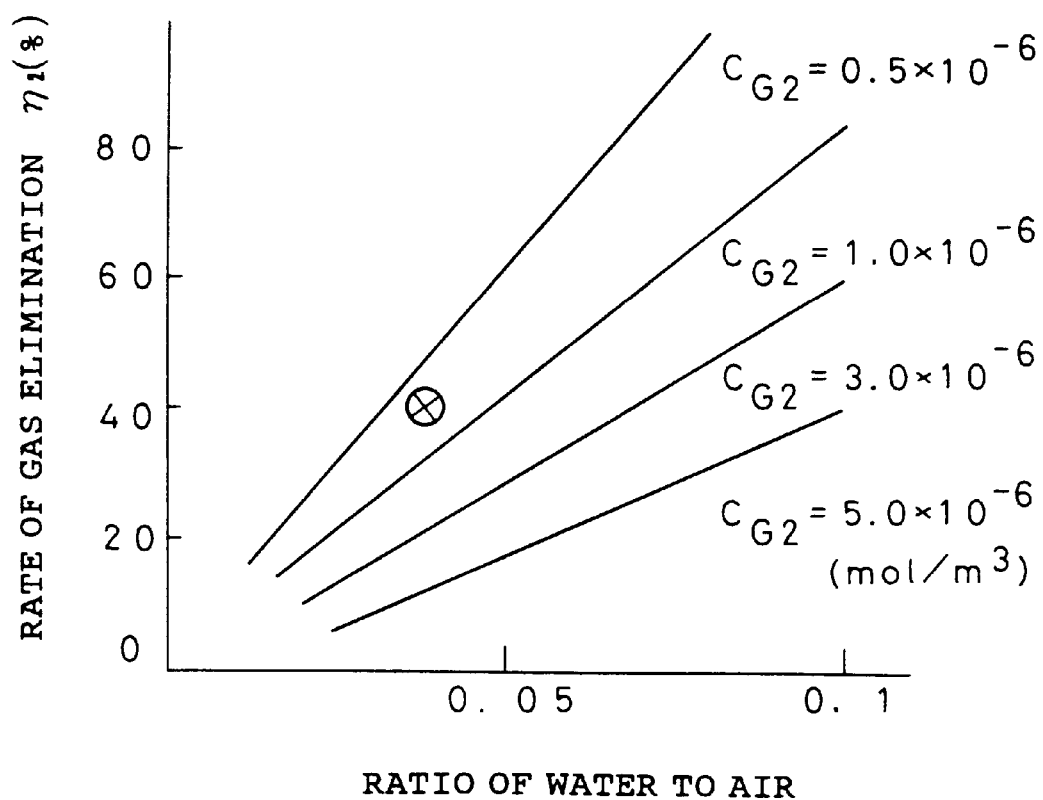
FIG. 14 is a graph diagram that shows the relationship between the ratio of water to air and the rate of gas elimination of ammonia gas $\eta_2$, when the above air washer sprays pure water.

FIG. 14 shows the relationship between the ratio of water to air and the rate of gas elimination $\eta_2$ of ammonia gas, when pure water is sprayed. Assume that the amount of spraying water (pure water) in the second area is seven litters/min., the rate of gas elimination $\eta_2$ becomes 40%, which corresponds to the ratio of water to air of 0.04.

Accordingly, the rate of total gas elimination $\eta_T=\eta_1+ (100-\eta_1)\cdot\eta_2/100$ becomes 91%, and the amount of the supplementary water from a supplementary water supply pipe 29 follows that 13.4−7.0=6.4 litters /min. (48% of all supplementary water).

Fourth Preferred Embodiment

Figure 15:
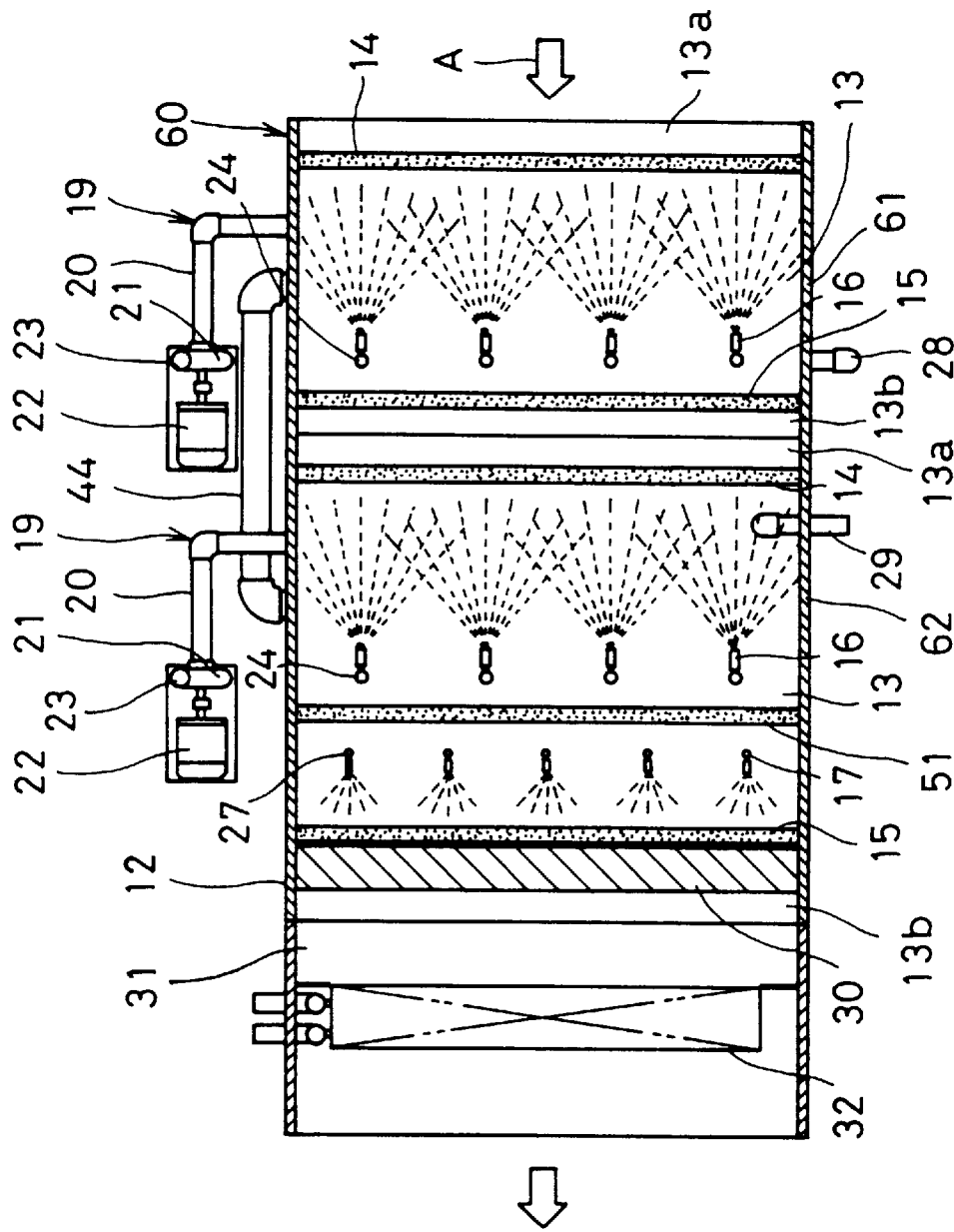
FIG. 15 is a plan sectional view of an air washer according to another preferred embodiment of the present invention.
Figure 16:
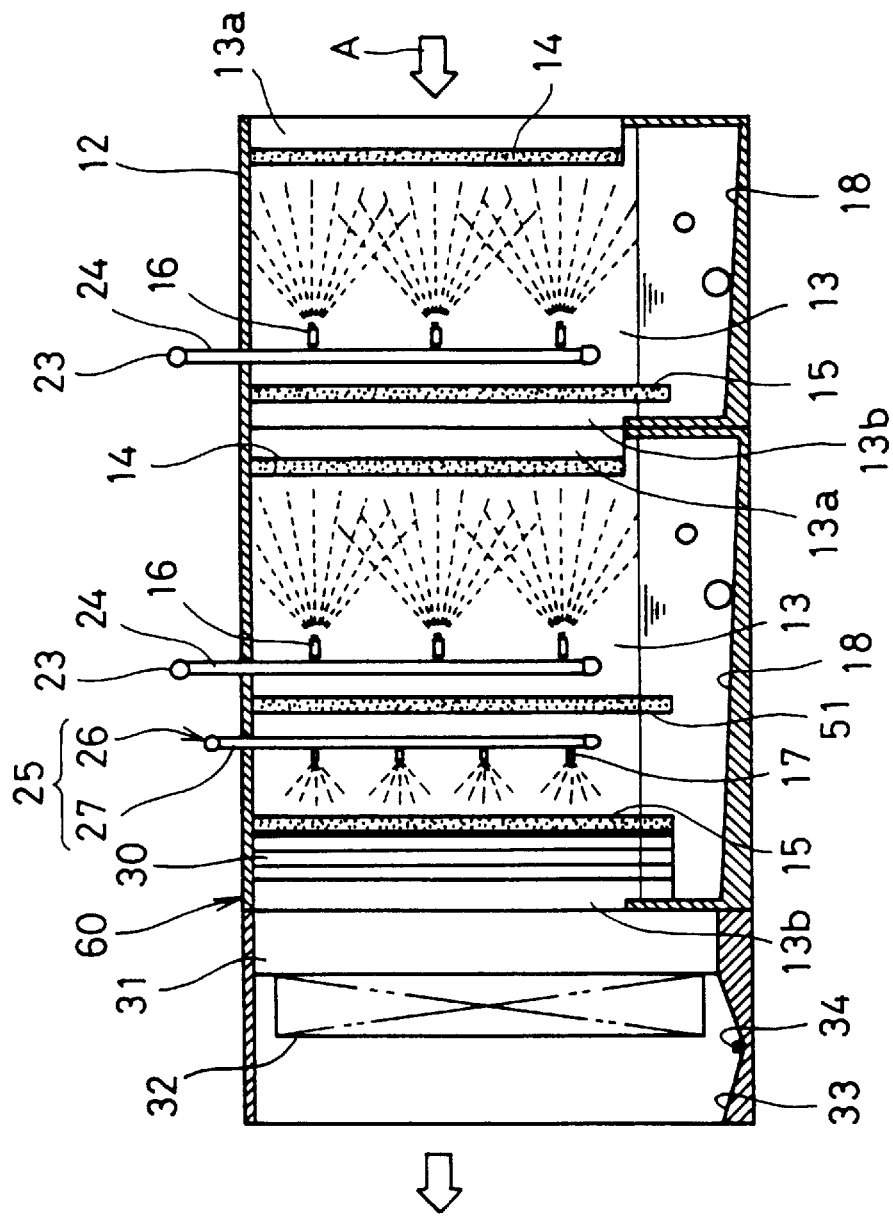
FIG. 16 is a longitudinal sectional view of the above air washer.
Figure 17:
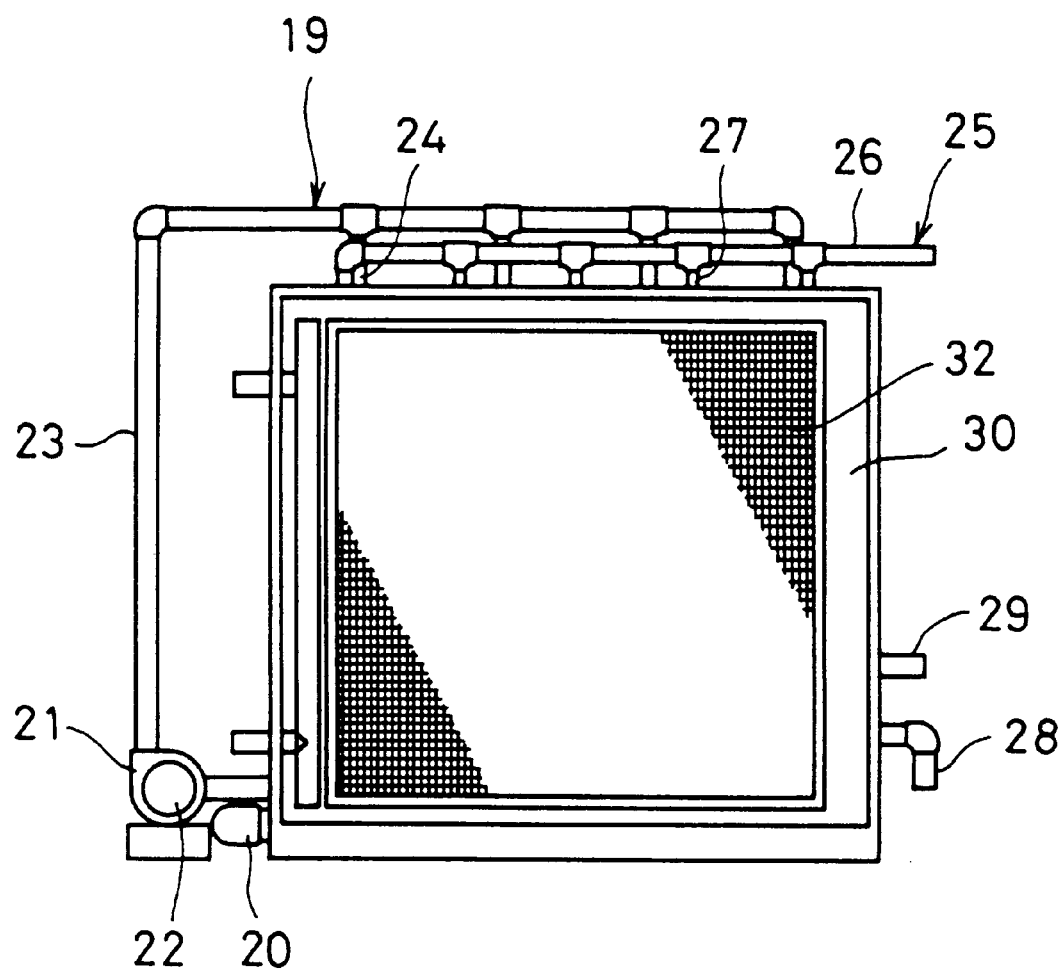
FIG. 17 is a transverse sectional view of the above air washer.

A fourth preferred embodiment is shown in FIGS. 15 to 17 wherein the same reference numerals have been retained for similar parts which have the same functions as in the foregoing embodiments, with their description omitted.

Referring to FIGS. 15 to 17, an air washer 60 has basic units 61 and 62, each comprising a water spray chamber 13, an inlet washer media 14, an outlet washer media 15, first stage nozzles 16, a water storage tank 18 and a circulating water supply system 19. The basic units 61 and 62 are connected to each other along an air flow.

An intermediate washer media 51 is provided in the basic unit 62 located downstream. Second stage nozzles 17 from which spraying water is sprayed in the forward direction to the air flow are located downstream of the intermediate washer media 51.

The pressure of spraying water, location and spray direction of the second stage nozzles 17 are so set that the spraying water diffuses widely and collides with the outlet washer media 15 with a predetermined flow of air admitted into the basic unit 62 located downstream. The second stage nozzles 17 may spray spraying water in the reverse direction to the air flow if the above-mentioned conditions are satisfied.

With this construction, a multistage purification of the air introduced is performed by the two basic units 61 and 62, and water of higher cleanliness is sprayed on to the downstream side of the air flow, thereby enhancing gas eliminating effect. This permits use in the areas in which the concentrations of atmospheric harmful gases are high.

A list of the effects of the present invention is given in Table 2. As can be seen from Table 2, excellent purifying effects can be obtained in both cases where the fourth preferred embodiment is applied to the atmosphere with the ordinary concentrations of gases, and where the same is applied to the atmosphere with high concentrations of gases.

TABLE 2

| Kind of Gas | Rate of gas elimination (%) 4th Pref. Embodiment | Gas concentration in atmosphere ($\mu g/m^3$) Ordinary area | High concentration area |
| --- | --- | --- | --- |
| $SO_2$ | 99 [100] | 10–20 | 100–180 |
| $NO_2$ | 50 [58] | 10–20 | 30–50 |
| NO | 60 [70] | 5–10 | 20–30 |
| $NH_3$ | 98 [100] | 5–10 | 20–60 |

Remarks: values in [ ] are obtained when a cooling coil is operated.

Fifth Preferred Embodiment

Figure 18:
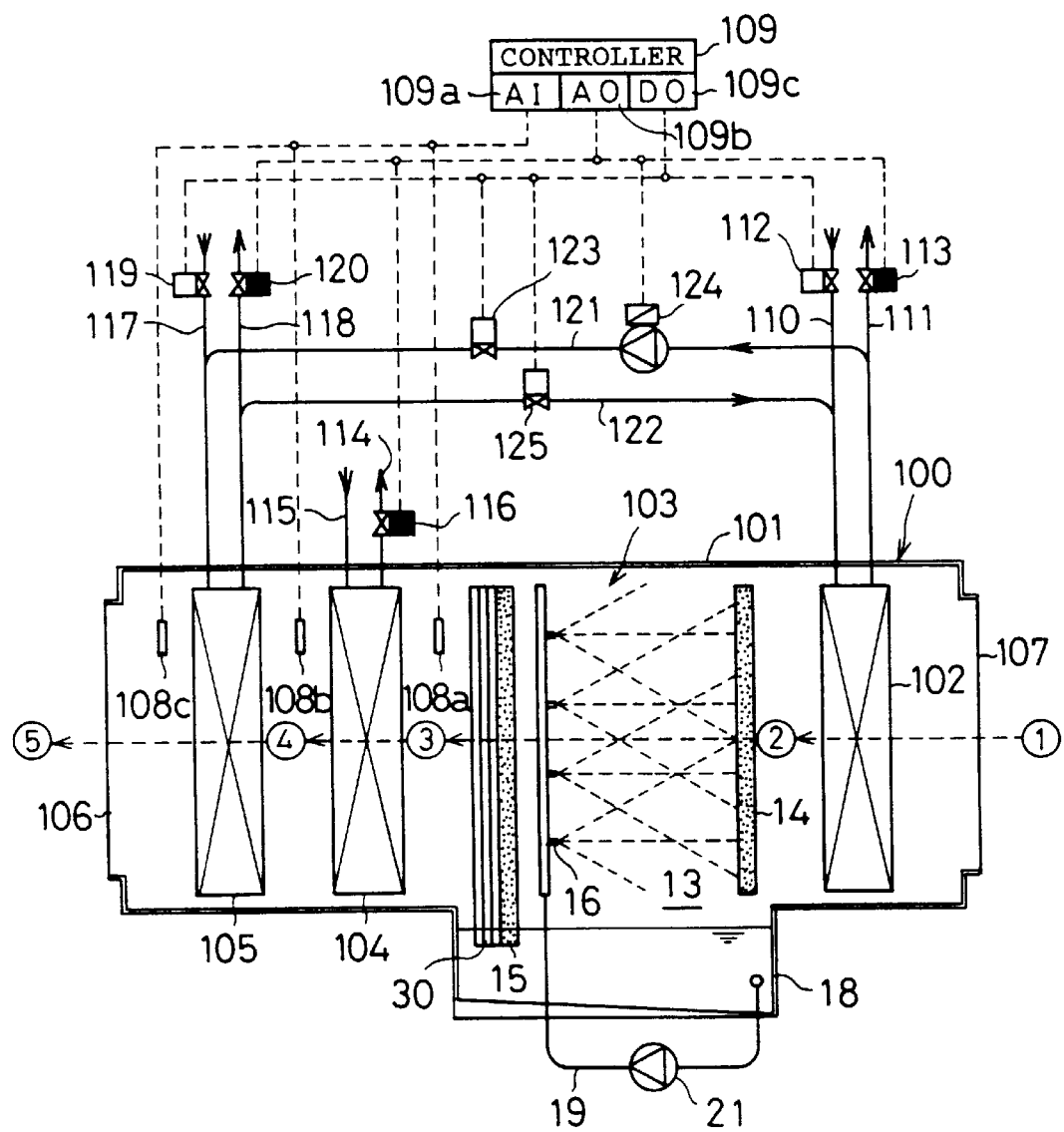
FIG. 18 is a longitudinal sectional view of an air conditioning system according to another preferred embodiment of the present invention.

A fifth preferred embodiment is shown in FIG. 18 wherein the same reference numerals have been retained for similar parts which have the same functions as in the foregoing embodiments, with their description omitted.

Referring to FIG. 18, an air conditioning system 100 has a housing 101 in which a heat exchange coil 102, an air washer 103, a cooling coil 104 and a heating coil 105 are located in this order from upstream in the direction of an air flow. An air inlet 106 is connected to an air supply fan (not shown) by which outside air (air) is introduced into the housing 101 through an outside air inlet 107.

A plurality of temperature sensors (temperature detecting means) 108a, 108b, 108c are located downstream of the air washer 103, the cooling coil 104 and the heating coil 105, respectively.

The temperature sensor 108a detects the temperature of the air humidified by passing through the air washer 103, the temperature sensor 108b detects the temperature of the air cooled by passing through the cooling coil 104, and the temperature sensor 108c detects the temperature of the air heated by passing through the heating coil 105. The temperature sensors 108a, 108b and 108c are connected to terminals 109a, 109b and 109c of a controller 109, respectively, and they give their respective outputs (detected values) to the controller 109.

The heat exchange coil 102 serving as heat exchange means is connected to a heating source and a cooling source (both not shown) through piping 110 and 111, to provide the communication of heat fluid medium (hot water and cool water) between the heating source and cooling source.

A switching valve 112 and a control valve 113 which control the flow of medium are disposed in a predetermined position of the piping 110 and 111, respectively. The switching valve 112 is connected to a DO (Digital Output) terminal 109c of the controller 109, and the control valve 13 is connected to an AO (Analog Output) terminal 109b.

The air washer 103 fundamentally comprises a water spray chamber 13, an inlet washer media 14, an outlet washer media 15, first stage nozzles 16, a water storage tank 18 and a circulating water supply system 19. The air washer 103 can be of any one of the foregoing embodiments.

The cooling coil 104 is connected to a cooling source (not shown) through piping 114 and 115. The piping 114 has a control valve 116 that is connected to the AO terminal 109b of the controller 109.

The heating coil 105 is connected to a heating source (not shown) through piping 117 and 118. The piping 117 has a switching valve 119 that is connected to the DO terminal 109c of the controller 109, and the piping 118 has a control valve 120 that is connected to the AO terminal 109b.

The piping 117 and 118 of the heating coil 105 are connected to connecting pipes 121 and 122 which connect the heating coil 105 and the heat exchange coil 102 to allow medium communication therebetween. A switching valve 123 and a circulating pump 124 controlled by an inverter are located in a predetermined position of the connecting pipe 121. A switching valve 125 is located in a predetermined position of the connecting pipe 122. The switching valves 123 and 125 are connected to the DO terminal 109c of the controller 109, and the circulating pump 124 is connected to the AO terminal 109b. The switching valves 123 and 125 and the circulating pump 124 form a control means whereby the flow of the medium passing through the connecting pipes 121 and 122 is controlled.

The air passed through the heating coil 105 (i.e., adjusted air) is discharged from the air inlet 106 by means of an air supply fan (not shown) and then supplied to a room or the like, through a duct.

A general operation of the air conditioning system 100 so constructed will be described with respect to the psychrometric charts shown in FIGS. 19 and 20. In FIGS. 19 and 20, symbols ① to ⑤ correspond to those in FIG. 18. That is, ① denotes the air near the outside air inlet 14; ② denotes the air passed through the heat exchange coil 102; ③ denotes the air after being humidified by the air washer 20; ④ denotes the air passed through the cooling coil 104; and ⑤ denotes the air passed through the heating coil 105.

When the air conditioning system 100 is started to select a cooling operation mode (e.g., summer morning), the controller 109 closes the switching valve 112 and control valve 113 of the heat exchange coil 102 and the switching valve 119 and control valve 120 of the heating coil 105, and opens the control valve 116 of the cooling coil 104, the switching valve 123 of the connecting pie 121 and the switching valve 125 of the connecting pipe 122. With this state, the medium flow for heat exchange is allowed between the heat exchange coil 102 and the heating coil 105.

The controller 109 controls the output frequency of the inverter and the speed of rotation of the circulating pump 124, based on their respective outputs (detected values) of the temperature sensors 108a and 108c. The air from the outside air inlet 14 which is introduced by driving an air supply fan (not shown), is appropriately cooled in the heat exchange coil 102. This cooling is performed by the medium fed from the heating coil 105, so that the air passed through the air washer 103 has a predetermined temperature (T1).

On the other hand, in the heating coil 105 the thermal energy of the medium moves to air, and thus heats the air to a predetermined temperature (T3) or its neighborhood. The low-temperature medium whose thermal energy has been absorbed by the heating coil 105 is fed to the heat exchange coil 102 as a cooling medium, through the connecting pipe 122.

Figure 19A:
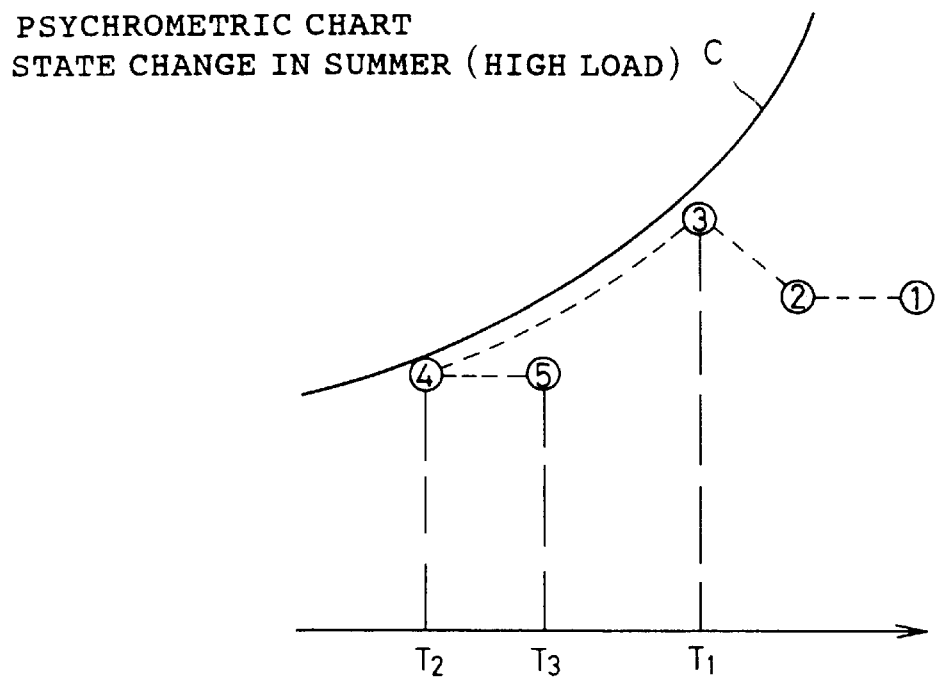
FIGS. 19(A) and 19(B) are psychrometric charts when the above air conditioning system runs a cooling operation under high load and low load, respectively.
Figure 19B:
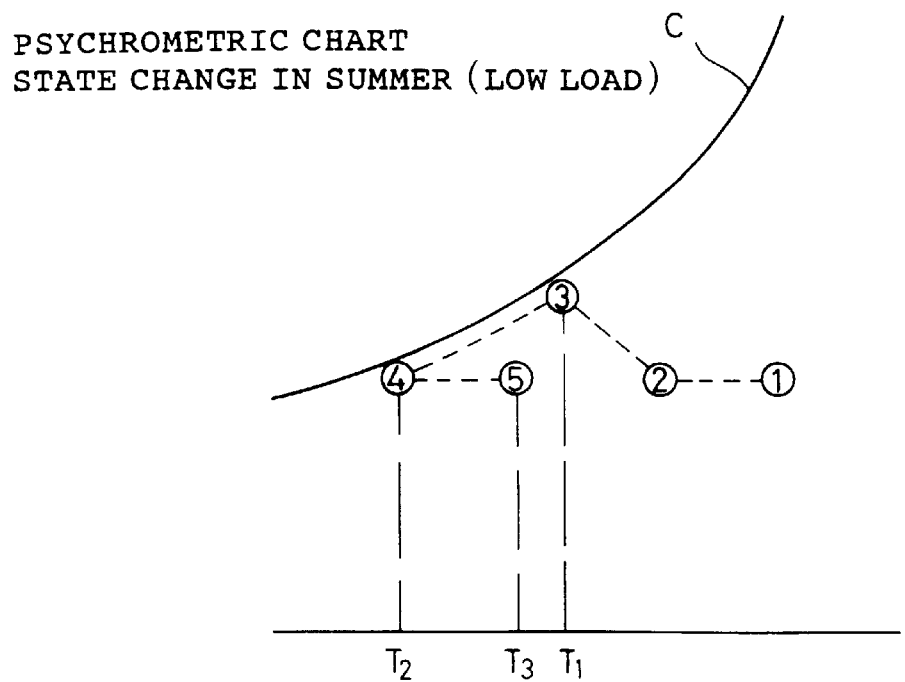
Figure 20:
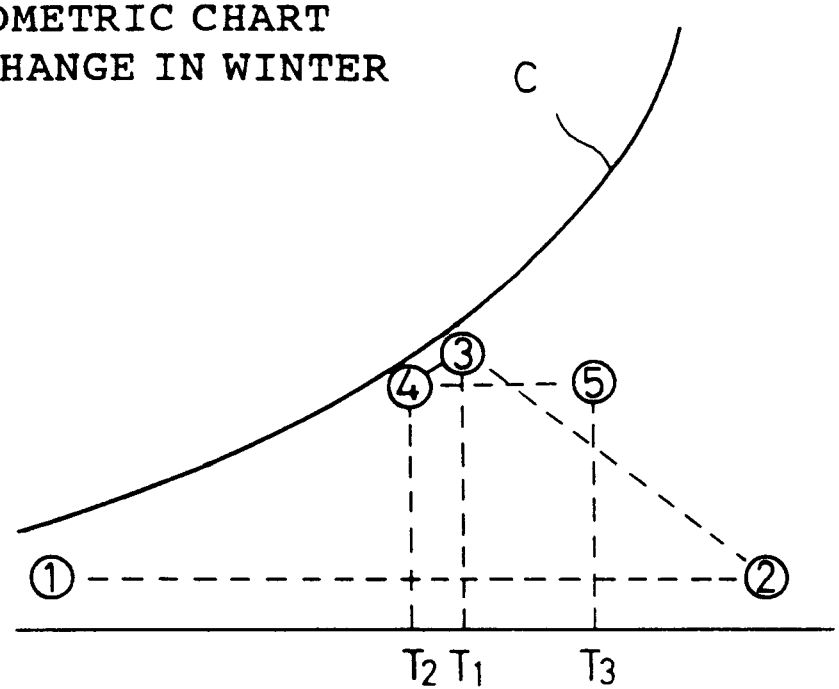
FIG. 20 is a psychrometric chart when the above air conditioning system runs a heating operation.
Figure 21:
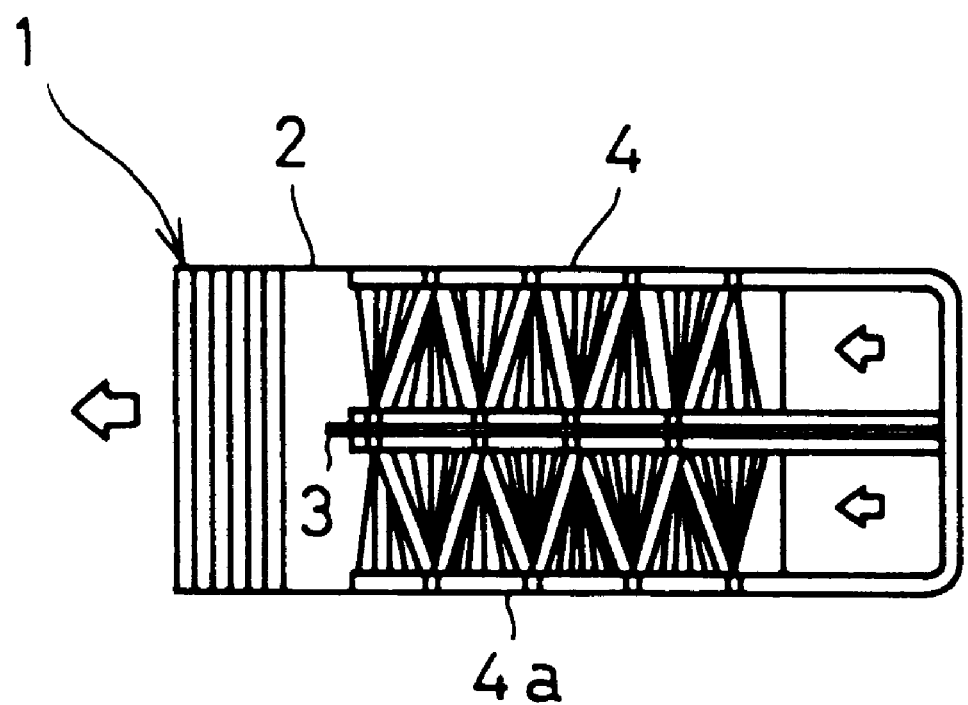
FIG. 21 is a schematic diagram showing the construction of prior art air washer.

As shown in FIGS. 19(A) and 19(B), temperature T1 of the air cooled in the heat exchange coil 102 will change depending on the magnitude of thermal load. All required for temperature T1 is to be not less than temperature T2, and it becomes not more than T2 when the operation mode for winter is needed.

The air cooled in the heat exchange coil 102 is then subjected to humidification, gas elimination and dust elimination in the air washer 103. Since the air washer 103 circulates spraying water without performing its cooling nor heating, the spraying water from the first stage nozzles 16 has a temperature equal to the wet-bulb temperature (adiabatic saturated temperature) of the air passed through the inlet of the air washer 103, namely the heat exchange coil 102, (i.e., the air indicated by symbol ② in FIGS. 18 and 19). The temperature of the air passed through the air washer 103 varies on a web-bulb temperature fixed line to approach saturation curve C, as indicated by symbols ② to ③ in FIG. 19.

The air after being subjected to humidification, gas elimination and dust elimination in the air washer 103 is then cooled (dehumidified) to a target temperature (T2) in the cooling coil 104. The controller 109 controls the control valve 116 based on the output value of the temperature sensor 108b, so that the air passed through the cooling coil 104 has a temperature on a target absolute humidity line. The air varies in nearly parallel to saturation curve C, due to the cooling in the cooling coil 104. This state is indicated by symbols ③ to ④ in FIG. 19.

The air passed through the cooling coil 104 is then heated to a desired temperature (T3) in the heating coil 105. As previously described, the medium from the heat exchange coil 102 is fed to the heating coil 105 through the connecting pipe 121, and the air cooled in the cooling coil 104 is heated to a predetermined temperature (T3) by the thermal energy which has moved from the air (outside air) to the medium in the heat exchange coil 102. In this case, the absolute humidity (dew-point temperature) of the air shows no change, as shown in symbols ④ to ⑤ in FIG. 19, and thus makes easy to obtain the desired temperature and humidity.

Meanwhile, when a heating (winter) operation mode (or an intermediate operation mode) is selected, the controller 109 closes the switching valves 123 and 125 of the connecting pipes 121 and 122, and opens the switching valve 112 and control valve 113 of the heat exchange coil 102, the control valve 116 of the cooling coil 104, and the switching valve 119 and control valve 120 of the heating coil 105. That is, this operation mode provides no medium flow in the connecting pipes 121 and 122.

Referring to FIG. 20, in order that the air passed through the air washer 103 has a predetermined temperature (T1), the air introduced into the housing 101 is heated by passing it through the heat exchange coil 102 (see symbols ① and ② in FIG. 20), followed by humidification (gas elimination and dust elimination) in the air washer 103 (see symbols ② and ③ in FIG. 20).

This humid air is cooled (dust elimination) to a target temperature (T2) in the cooling coil 104 (see symbols ③ and ④ in FIG. 20), heated in the heating coil 105 (see symbols ④ and ⑤ in FIG. 20), and passes through a duct to a room for which air conditioning is necessary, by means of an air supply fan (not shown).

Thus, the air introduced into the air conditioning system 100 is humidified by the air washer 103 having a high efficiency of saturation, and the humid air is cooled in the cooling coil 104 (cooling means), thereby making easy to obtain air having stable high humidity (96–97% in relative humidity).

Since the air after being humidified and cooled is merely heated to a predetermined temperature, its control is easy. It is therefore possible to use a temperature sensor that is inexpensive and has high accuracy (error ±0.1° C.), instead of a dew-point temperature sensor generally used in prior art.

Furthermore, since in the summer operation mode the medium flow is allowed between the heat exchange coil 102 and the heating coil 105, the load applied to the cooling source can be reduced to realize an air conditioning system causing less energy consumption. In addition, when used, as humidifying means, the air washer 103 having high efficiency of saturation, gas elimination and dust elimination, and the air washer 103 is used together with the cooling coil 104, the effects of eliminating the dust or harmful gases contained in air are enhanced to realize an air conditioning system capable of feeding clean air all year round.

What is claimed is:

1. An air washer having a basic unit, the basic unit comprising:

a water spray chamber in which an air flow takes place from an air inlet to an air outlet;

an inlet washer media disposed in the air inlet of the water spray chamber;

an outlet washer media disposed in the air outlet of the water spray chamber;

first stage nozzles from which spraying water is sprayed in the reverse direction to the air flow, are located downstream from the inlet washer media and arranged in plural positions both along vertical and horizontal directions;

a water storage tank for receiving spraying water running down, located below the water spray chamber; and a circulating water supply system that circulates the circulating water in the water storage tank to the first stage nozzles, characterized in that:

the inlet washer media and the outlet washer media are formed in a mat-shape with a predetermined thickness;

the spraying water from the first stage nozzles is sprayed in such manner that some of the spraying water reaches the inlet washer media, some of the spraying water collides with surfaces of a ceiling and walls and the remaining spraying water moves together with the air flow to reach the outlet washer media, second stage nozzles from which spraying water directed against the outlet washer media is sprayed obliquely downward from the upper part in the forward direction to the air flow, are disposed in approximately the same positions as the first stage nozzles and arranged in plural positions along a horizontal direction;

a supplementary water supply system for supplying supplementary water to the second stage nozzles is provided, and an overflow pipe is provided in the storage tank to supply the required quantity of supplementary water for maintaining a concentration of harmful cases in the circulating water at lower than the predetermined value.

2. The air washer of claim 1, further comprising: an intermediate washer media located downstream from the first stage nozzles; and second stage nozzles from which spraying water is sprayed in the reverse direction to the air flow so as not to reach the intermediate washer media, or in the forward direction to the air flow, located downstream of the intermediate washer media and arranged in plural positions along vertical and horizontal directions.

3. The air washer of claim 1 or 2, further comprising:

another basic unit being continuously provided upstream of the air flow;

a connecting pipe that connects the water storage tank of the basic unit located upstream with the basic unit located downstream; and an overflow pipe disposed only in the water storage tank of the basic unit located upstream.

4. An air conditioning system comprising:

an air washer having a water spray chamber in which an air flow takes place from an air inlet to an air outlet; an inlet washer media disposed in the air inlet of the water spray chamber; an outlet washer media disposed in the air outlet of the water spray chamber; and nozzles from which spraying water directed against the inlet washer media is sprayed in the reverse direction to the air flow;

heat exchange means for heating or cooling air to a predetermined water spray chamber outlet temperature higher than a target temperature, located upstream from the air inlet of the water spray chamber;

cooling means for cooling air to a target temperature, located downstream from the air outlet of the water spray chamber;

heating means for heating the air cooled with the cooling means to a predetermined outlet temperature;

connecting means for controlling heat exchange fluid medium flow between the heat exchange means and the heating means;

temperature detecting means for detecting the temperatures of airs in their respective positions in the air washer, cooling means and heating means; and control means for controlling the heat exchange means, cooling means, heating means and connecting means, based on the detected values of the temperature detecting means.

* * * * *